United States Patent
Park et al.

(10) Patent No.: US 9,543,221 B2
(45) Date of Patent: Jan. 10, 2017

(54) METHOD OF MANUFACTURING LIGHT-EMITTING APPARATUS, LIGHT-EMITTING MODULE INSPECTING APPARATUS, AND METHOD OF DETERMINING WHETHER LIGHT-EMITTING MODULE MEETS QUALITY REQUIREMENT

(71) Applicant: Samsung Electronics Co., Ltd., Suwon-si (KR)

(72) Inventors: Dae-seo Park, Suwon-si (KR); Ka-ram Lee, Suwon-si (KR); Choo-ho Kim, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/937,347

(22) Filed: Nov. 10, 2015

(65) Prior Publication Data
US 2016/0133805 A1    May 12, 2016

(30) Foreign Application Priority Data
Nov. 11, 2014    (KR) .................. 10-2014-0156246

(51) Int. Cl.
*H01L 21/20* (2006.01)
*H01L 21/66* (2006.01)
(Continued)

(52) U.S. Cl.
CPC .............. *H01L 22/12* (2013.01); *H01L 33/58* (2013.01); *H01L 33/54* (2013.01); *H01L 2224/14* (2013.01);
(Continued)

(58) Field of Classification Search
CPC .......... H01L 21/8238; H01L 21/02332; H01L 21/048; H01L 21/28079; H01L 21/28556; H01L 27/0814; H01L 27/0922; H01L 29/6603; H01L 51/102; H01L 51/5296
(Continued)

(56) References Cited

U.S. PATENT DOCUMENTS 6,372,608 B1    4/2002    Shimoda et al.
6,645,830 B2    11/2003    Shimoda et al.
(Continued)

FOREIGN PATENT DOCUMENTS

KR          10-0990641 B1      10/2010
KR    10-2011-0045227 A        5/2011
(Continued)

*Primary Examiner* — David Nhu
(74) *Attorney, Agent, or Firm* — Muir Patent Law, PLLC

(57) ABSTRACT

A method of manufacturing a light-emitting apparatus includes disposing a substrate on a support; disposing a light-emitting package including a light-emitting device on the substrate so as to allow the light-emitting package to be positioned at a target position on the substrate; applying energy to the light-emitting package to make the light-emitting device emit light; and analyzing the light that is emitted from the light-emitting device due to the energy, and determining a position where the light-emitting package is actually disposed. Thus, the light-emitting apparatus may be easily and inexpensively manufactured, and may generate a limited number of spots and provide improved uniform brightness.

20 Claims, 19 Drawing Sheets

(51) Int. Cl.
*H01L 33/58* (2010.01)
*H01L 33/54* (2010.01)

(52) U.S. Cl.
CPC ............... *H01L 2224/16225* (2013.01); *H01L 2933/0033* (2013.01); *H01L 2933/0058* (2013.01)

(58) Field of Classification Search
USPC ... 438/141, 91, 99, 106, 197, 199, 463, 680, 438/535, 603, 604, 681, 746; 257/E21.006, 257/E21.007, E21.046, 257/E21.053, E21.055, E21.077, E21.084, 257/E21.126, E21.127, E21.17, E21.185, 257/E21.267, E21.278, E21.293, E21.347, 257/E21.352, E21.366
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,697,141 B2 * | 4/2010 | Jones | E21B 47/102 356/445 |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,068,661 B2 | 11/2011 | Onushkin et al. | |
| 8,129,711 B2 | 3/2012 | Kang et al. | |
| 8,179,938 B2 | 5/2012 | Kim | |
| 8,262,987 B2 * | 9/2012 | Tago | A23L 3/10 422/1 |
| 8,263,987 B2 | 9/2012 | Choi et al. | |
| 8,324,646 B2 | 12/2012 | Lee et al. | |
| 8,331,649 B2 | 12/2012 | Ji et al. | |
| 8,346,497 B2 * | 1/2013 | Miyairi | G01N 21/9501 702/117 |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,136,430 B2 * | 9/2015 | Tak | H01L 33/12 |
| 2012/0249779 A1 | 10/2012 | Ji et al. | |
| 2013/0027543 A1 | 1/2013 | Boeykens et al. | |
| 2013/0178002 A1 | 7/2013 | Lam et al. | |
| 2014/0080230 A1 | 3/2014 | Sohn et al. | |

FOREIGN PATENT DOCUMENTS

| | | |
|---|---|---|
| KR | 10-1089787 B1 | 12/2011 |
| KR | 10-1102043 B1 | 1/2012 |
| KR | 10-1174755 B1 | 8/2012 |
| KR | 10-1215306 B1 | 12/2012 |
| KR | 10-2013-0130567 A | 12/2013 |
| KR | 10-1357002 B1 | 2/2014 |
| KR | 10-2014-0087134 A | 7/2014 |

* cited by examiner

METHOD OF MANUFACTURING LIGHT-EMITTING APPARATUS, LIGHT-EMITTING MODULE INSPECTING APPARATUS, AND METHOD OF DETERMINING WHETHER LIGHT-EMITTING MODULE MEETS QUALITY REQUIREMENT

CROSS-REFERENCE TO RELATED APPLICATION

This application claims priority to and the benefit of Korean Patent Application No. 10-2014-0156246, filed on Nov. 11, 2014, in the Korean Intellectual Property Office, the disclosure of which is incorporated herein in its entirety by reference.

TECHNICAL FIELD

The inventive concept relates to a method of manufacturing a light-emitting apparatus, a light-emitting module inspecting apparatus, and a method of determining whether a light-emitting module meets a quality requirement, and more particularly, to a method of easily and inexpensively manufacturing a light-emitting apparatus generating less spots and having improved uniform brightness, a light-emitting module inspecting apparatus, and a method of determining whether a light-emitting module meets a quality requirement.

BACKGROUND

Due to its high energy efficiency and small size, a light-emitting diode (LED) has recently been highlighted for use as a light source for a lighting apparatus. Also, LEDs may be used not only in lighting apparatuses but also in flat panel displays, optical communication devices, etc.

A light-emitting module for mounting a light-emitting package on a substrate is used for various products. In this regard, techniques for satisfying various requirements such as spot prevention, uniform brightness, or the like are required.

SUMMARY

The inventive concept provides a method of inexpensively and easily manufacturing a light-emitting apparatus generating less spots and having improved uniform brightness.

The inventive concept also provides a light-emitting module inspecting apparatus for easily inspecting a light-emitting apparatus generating less spots and having improved uniform brightness so as to inexpensively manufacture a light-emitting device.

The inventive concept also provides a method of inexpensively and easily determining whether a light-emitting module meets a quality requirement.

According to an aspect of the inventive concept, there is provided a method of manufacturing a light-emitting apparatus, the method including operations of disposing a substrate on a support; disposing a light-emitting package including a light-emitting device on the substrate so as to allow the light-emitting package to be positioned at a target position on the substrate; applying energy to the light-emitting package to make the light-emitting device emit light; and determining a position where the light-emitting package is actually disposed by analyzing the light that is emitted from the light-emitting device due to the energy.

The operation of applying may include an operation of irradiating light onto the light-emitting device. The operation of irradiating may include operations of focusing a portion of the irradiated light; and irradiating the focused portion of the irradiated light onto the light-emitting device. The operation of focusing may be performed by a light focusing optical system.

The light-emitting package may have a window with a predetermined shape. The operation of determining the position may include operations of sensing the light that is emitted from the light-emitting device; and determining the position of the light-emitting package by determining a center of the window with the predetermined shape.

A wavelength of the light that is irradiated to the light-emitting device may be shorter than a wavelength of the light that is emitted from the light-emitting device. The operation of applying may include an operation of applying an electric power to the light-emitting device. The method may further include an operation of disposing a lens on the light-emitting package based on the position where the light-emitting package is actually disposed. The lens may be disposed so that a center of the window of the light-emitting package may be on a central axis of the lens. The operation of disposing the lens may include operations of setting the position where the light-emitting package is actually disposed as a new target position for the lens; and disposing the lens at the new target position.

The light-emitting package may not include a phosphor.

According to another aspect of the inventive concept, there is provided a light-emitting module inspecting apparatus including a support on which a substrate is disposed, a light-emitting package that includes a light-emitting device being disposed on the substrate; an energy applier for applying energy to the light-emitting package to make the light-emitting device emit light; a light sensing part for sensing the light that is emitted from the light-emitting device; and a position determiner for determining a position of the light-emitting package based on information sensed by the light sensing part.

The energy may be applied to the light-emitting device in the light-emitting package. The energy applier may be configured to irradiate light to the light-emitting device. A wavelength of the irradiated light may be shorter than a wavelength of the light emitted from the light-emitting device. The light emitted from the light-emitting device may be blue light and the light irradiated to the light-emitting device may be ultraviolet (UV) light. The light emitted from the light-emitting device may be red light and the light irradiated to the light-emitting device may be green light or light having a wavelength shorter than a wavelength of the green light.

The energy applier may include a light focusing optical system configured to focus a portion of the irradiated light onto the light-emitting device. The light-emitting device may include an anode, a cathode, and an emission layer between the anode and the cathode, and an energy of the light that irradiated onto the light-emitting device may be greater than a bandgap energy of the emission layer.

Selectively, the energy applier may be configured to apply an electric power to the light-emitting device. The light-emitting package may have a window with a predetermined shape, and the position determiner may determine the position of the light-emitting package by determining a center of the window with the predetermined shape.

The light-emitting module inspecting apparatus may determine whether the light-emitting package meets a quality requirement based on the information sensed by the light sensing part. The light-emitting module inspecting apparatus may further include a quality requirement determiner that extracts a contour of a window of the light-emitting package based on the information sensed by the light sensing part, and determines whether the light-emitting package meets the quality requirement based on a shape of the extracted contour.

The light-emitting module inspecting apparatus may determine whether the light-emitting package meets a quality requirement based on a distance between the position of the light-emitting package determined by the position determiner and a target position of the light-emitting package.

According to another aspect of the inventive concept, there is provided a method of manufacturing a light-emitting apparatus, the method including operations of disposing a light-emitting package including a light-emitting device on a substrate so as to allow the light-emitting package to be positioned at a target position on the substrate, fiducial marks being provided on the substrate; applying energy to the light-emitting device to make the light-emitting device emit light; and obtaining image information about the light that is emitted from the light-emitting device.

The operation of obtaining may include an operation of obtaining information about a wavelength distribution of the light emitted from the light-emitting device. After the operation of obtaining the image information, the method may further include an operation of determining the light-emitting package as a non-defective product if a peak wavelength of the light emitted from the light-emitting device is within a predetermined range of a normal peak wavelength, or determining the light-emitting package as a defective product if the peak wavelength of the light emitted from the light-emitting device is not within the predetermined range of the normal peak wavelength.

The operation of obtaining may include an operation of extracting a contour of a window of the light-emitting package based on the light emitted from the light-emitting device. The window of the light-emitting package may have a predetermined shape, and the method may further include an operation of determining the light-emitting package as a defective product if the extracted contour of the window differs from the predetermined shape.

The window of the light-emitting package may have a predetermined shape, and the method may further include operations of detecting a position of a center of the window; and storing the position of the center of the window as a position of the light-emitting package. The method may further include operations of calculating a distance between the position of the light-emitting package and the target position and determining that the light-emitting apparatus is non-defective or defective based on the calculated distance.

The light-emitting package may not include a phosphor.

According to another aspect of the inventive concept, there is provided a method of manufacturing a light-emitting apparatus including providing a substrate; disposing a light-emitting package including a package frame having a window and a light-emitting device positioned in the window, on the substrate; applying energy to the light-emitting package so that the light-emitting device emits light; and determining a position of the window by analyzing the light emitted from the light-emitting device.

The step of applying the energy may include irradiating light to the light-emitting device. A wavelength of the light irradiated to the light-emitting device may be shorter than a wavelength of the light emitted from the light-emitting device.

The step of applying the energy may include applying an electric power to the light-emitting device so that the light-emitting device emits the light by recombination of electrons and holes generated by the electric power.

The method may further include a step of mounting a lens on the light-emitting package so that an optical axis of the lens passes through a center of the window, based on the determined position of the window.

The step of disposing the light-emitting package on the substrate may be guided by a fiducial mark formed on the substrate so that the disposed light-emitting package is positioned at or adjacent to a target position determined by the fiducial mark.

The method may further include a step of determining whether the determined position of the window is within a predetermined distance with reference to the target position determined by the fiducial mark.

The method may further include steps of obtaining an image of the window by collecting the light emitted from the light-emitting device; determining a shape of the window based on the obtained image of the window; and determining whether the determined shape of the window differs from a predetermined shape of the window.

The method may further include a step of determining whether a peak wavelength of the light emitted from the light-emitting device is within a predetermined range of a predetermined wavelength, bases on the analysis of the light emitted from the light-emitting device.

The light-emitting package may not include a phosphor.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
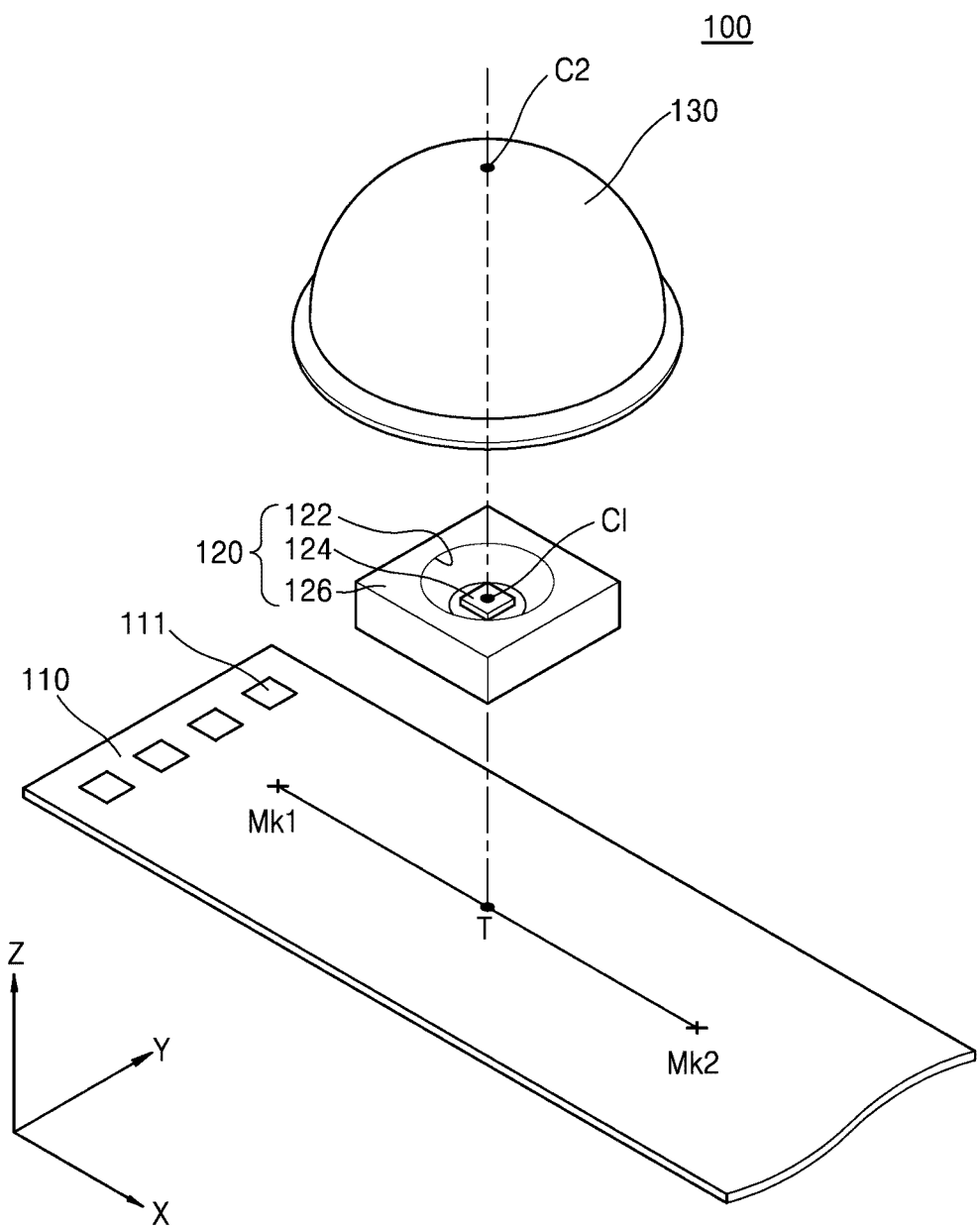
FIG. 1 is an exploded perspective view of a light-emitting apparatus, according to an exemplary embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. In the drawings, similar reference numerals denote similar configuring elements, and the thicknesses of layers and regions are exaggerated for clarity.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a number, an operation, a component, and/or groups thereof, not excluding the existence of one or more other numbers, one or more other operations, one or more other components and/or groups thereof.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is an exploded perspective view of a light-emitting apparatus 100, according to an exemplary embodiment of the inventive concept. FIGS. 2 through 8 are cross-sectional views of structures of a substrate included in the light-emitting apparatus, according to exemplary embodiments of the inventive concept.

Referring to FIG. 1, a light-emitting package 120 may be arranged on a substrate 110, and a light extraction lens 130 may be arranged on the light-emitting package 120.

Figure 2:
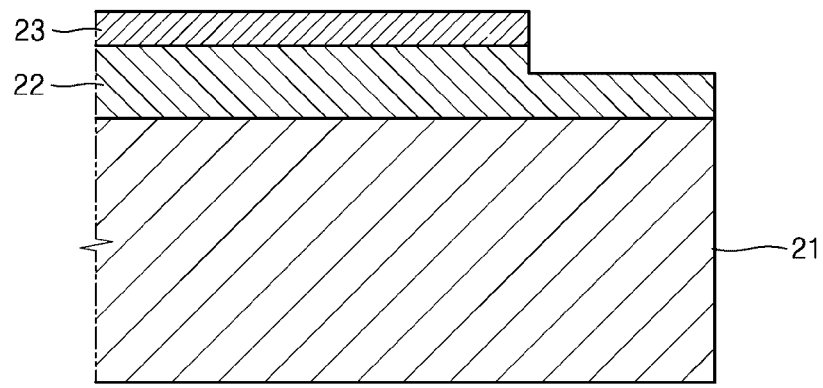
FIGS. 2 through 8 are cross-sectional views of structures of a substrate included in the light-emitting apparatus, according to exemplary embodiments of the inventive concept.

The substrate 110 may be a metal substrate as shown in FIG. 2.

As illustrated in FIG. 2, the substrate 110 includes an insulating layer 22 formed on a first metal layer 21, and a second metal layer 23 formed on the insulating layer 22. A stepped region to expose the insulating layer 22 is formed at one side end of the metal substrate.

The first metal layer 21 may be formed of a material having an excellent heat dissipation property, and may have a single-layer structure or a multi-layer structure. The insulating layer 22 may be formed of an insulating material including an inorganic material or an organic material. For example, the insulating layer 22 may be formed of an epoxy-based insulating resin including a metal powder such as an Al powder so as to improve thermal conductivity. In general, the second metal layer 23 may be formed of a Cu thin-film.

Figure 3:
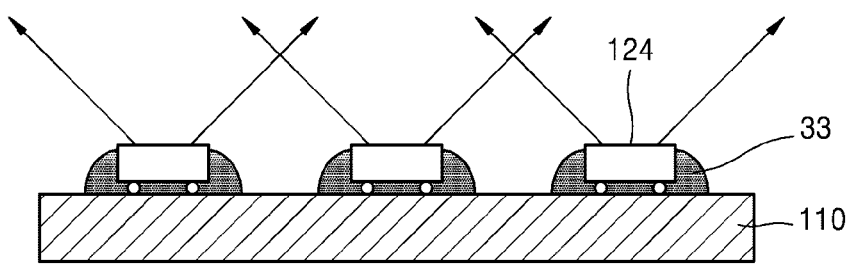

In an embodiment, as illustrated in FIG. 3, the substrate 110 may be a circuit board having a structure in which a package having light-emitting devices 124 is mounted on the substrate 110, and then a waterproof agent and/or a light reflection material 33 surrounds the package.

Figure 4:
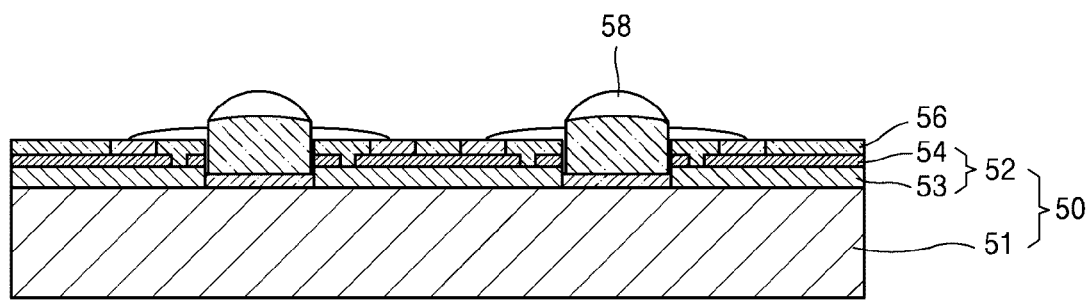

In another embodiment, as illustrated in FIG. 4, a circuit board 50 may have a structure including a heat dissipation supporting substrate 51 and a resin coating copper clad laminate (RCC) 52 stacked on the heat dissipation supporting substrate 51. The RCC 52 may include an insulating layer 53 and a circuit layer 54 formed of a copper thin film stacked on the insulating layer 53. A protective layer 56 formed of a liquid photo solder resist (PSR) is stacked on the circuit layer 54. A portion of the RCC 52 is removed, so that a metal copper clad laminate (MCCL) having at least one groove to which a light-emitting device or package 58 is mounted is formed. In the circuit board 50, an insulating layer at a lower region of the light-emitting device or package 58 at which a light source is positioned is removed, so that the light source contacts the heat dissipation supporting substrate 51, and heat that is generated in the light source is directly transferred to the heat dissipation supporting substrate 51, and thus a heat dissipation performance is enhanced. The circuit board 50 may be used as a substrate included in the light-emitting apparatus illustrated in FIG. 1.

Figure 5:
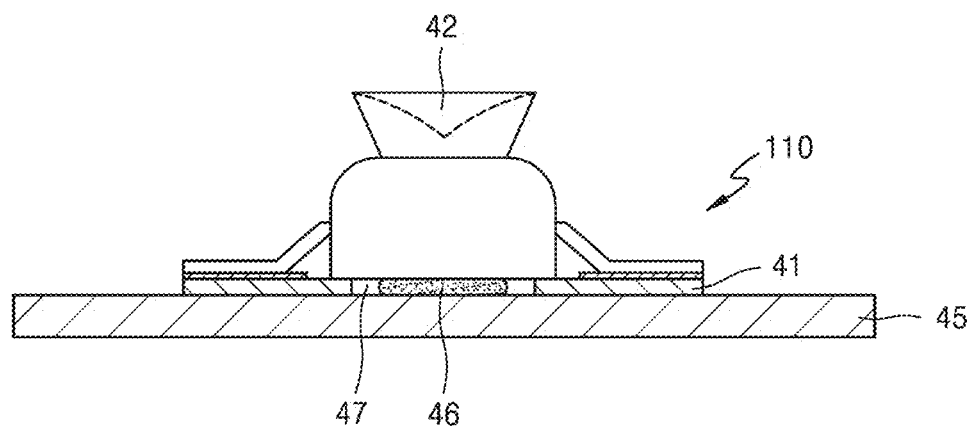

In another embodiment, the substrate 110 may include a flexible substrate as shown in FIG. 5.

As illustrated in FIG. 5, the flexible substrate may be provided as a slim substrate unit whose thickness and weight may be decreased and that may reduce the manufacturing costs and may substantially increase a heat dissipation efficiency. In the present embodiment, the slim substrate unit may be configured of a circuit board having at least one through hole, and a light-emitting diode (LED) chip or a package vertically combined with a portion of the circuit board that corresponds to the through hole. When the flexible substrate having the decreased thickness and weight is used as a substrate member of the slim substrate unit, the slim substrate unit may be slim and light-weighted, and the manufacturing costs therefor may be reduced, and since the LED chip or the package is directly attached to a supporting substrate by using a heat dissipation adhesive, the heat dissipation efficiency with respect to heat from the LED chip or the package may be increased.

Referring to FIG. 5, the flexible substrate may include a printed circuit board (PCB) 41 in which at least one through hole 47 is formed; an LED chip or package 42 that is vertically combined with a portion of the PCB 41 that corresponds to the through hole 47; a supporting substrate 45 on which the PCB 41 is mounted; and a heat dissipation adhesive 46 that is arranged in the through hole 47 so as to attach a bottom surface of the LED chip or package 42 to a top surface of the supporting substrate 45. The bottom surface of the LED chip or package 42 may be the bottom surface of the LED chip that is externally-exposed or may be a metal block or a bottom surface of a lead frame on which a chip is mounted.

Figure 6:
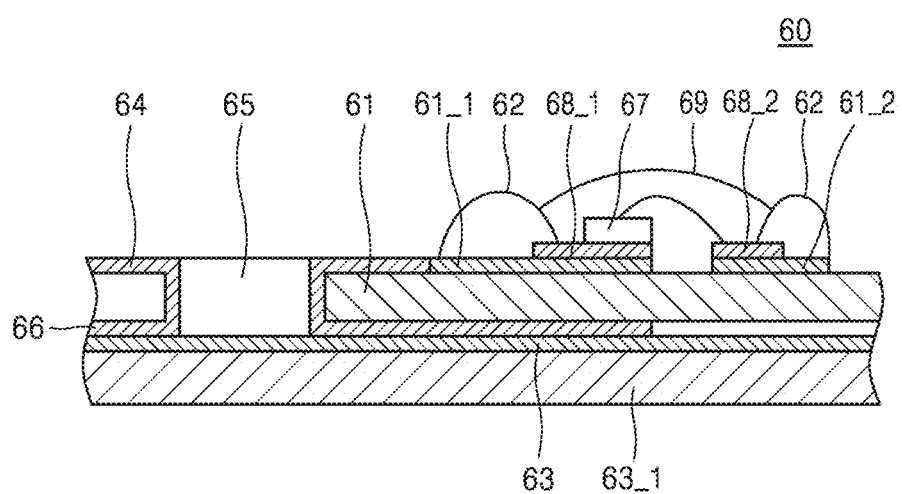

In another embodiment, as illustrated in FIG. 6, a substrate 61 is an insulating substrate and has a structure in which circuit patterns 61_1 and 61_2 formed of a copper laminate are formed on a top surface of the insulating substrate, and an insulating thin film layer 63 that is thinly coated as an insulating material may be formed on a bottom surface of the insulating substrate. Here, various coating methods such as a sputtering method or a spraying method may be used. Also, top and bottom heat diffusion plates 64 and 66 may be formed on the top and bottom surfaces of the substrate 61 so as to dissipate heat that is generated in an LED module 60, and in particular, the top heat diffusion plate 64 directly contacts the circuit pattern 61_1. For example, the insulating material that is used as the insulating thin film layer 63 has thermal conductivity that is significantly lower than that of a heat pad, but since the insulating thin film layer 63 has a very small thickness, the insulating thin film layer 63 may have a thermal resistance that is significantly lower than that of the heat pad. The heat that is generated in the LED module 60 may be transferred to the bottom heat diffusion plate 66 via the top heat diffusion plate 64 and then may be dissipated to a chassis 63_1.

A through hole 65 may be formed to penetrate through the substrate 61 and the top and bottom heat diffusion plates 64 and 66. An LED package may include an LED chip 67, LED electrodes 68_1 and 68_2, a plastic molding case 62, a lens 69, or the like. The substrate 61 may have a circuit pattern that is formed by laminating a copper layer onto an FR4-core that is a ceramic or epoxy resin-based material and then by performing an etching process.

The LED module 60 may have a structure in which at least one of a red-light LED that emits red light, a green-light LED that emits green light, and a blue-light LED that emits blue light is mounted.

Figure 7:
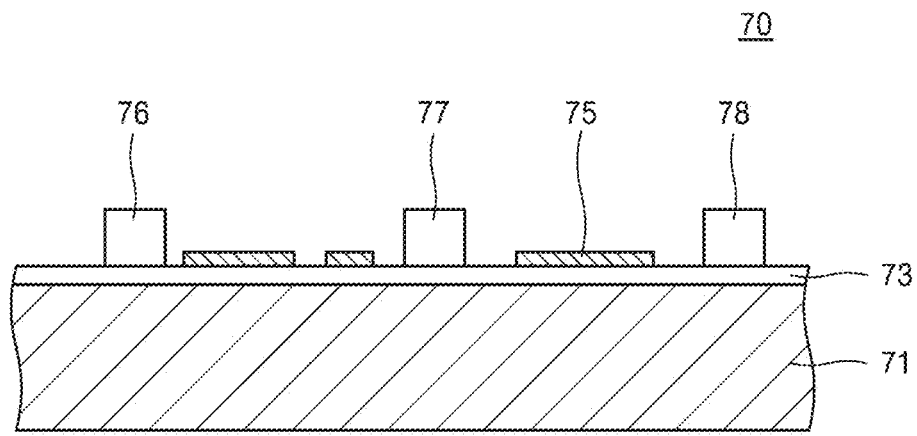

In another embodiment, as illustrated in FIG. 7, a metal substrate 70 may include a metal plate 71 that is formed of Al or an Al alloy, and an Al anodized layer 73 that is formed on a top surface of the metal plate 71. Heat generation devices 76, 77, and 78 such as LED chips and/or integrated circuit (IC) chips such as current and/or voltage controllers that drive or control the LED chips may be mounted on the metal plate 71. The Al anodized layer 73 may insulate a wiring 75 from the metal plate 71.

The metal substrate 70 may be formed of Al or an Al alloy that is relatively less expensive. Alternatively, the metal substrate 70 may be formed of another material such as titanium or magnesium that may be anodized.

The Al anodized ($Al_2O_3$) layer 73 that is obtained by anodizing Al has a relatively high heat transfer characteristic of about 10 through 30 W/mK. Thus, the metal substrate 70, including the Al anodized layer 73, may have a heat dissipation characteristic that is more excellent that that of a polymer substrate-based PCB or an MCPCB according to the related art.

Figure 8:
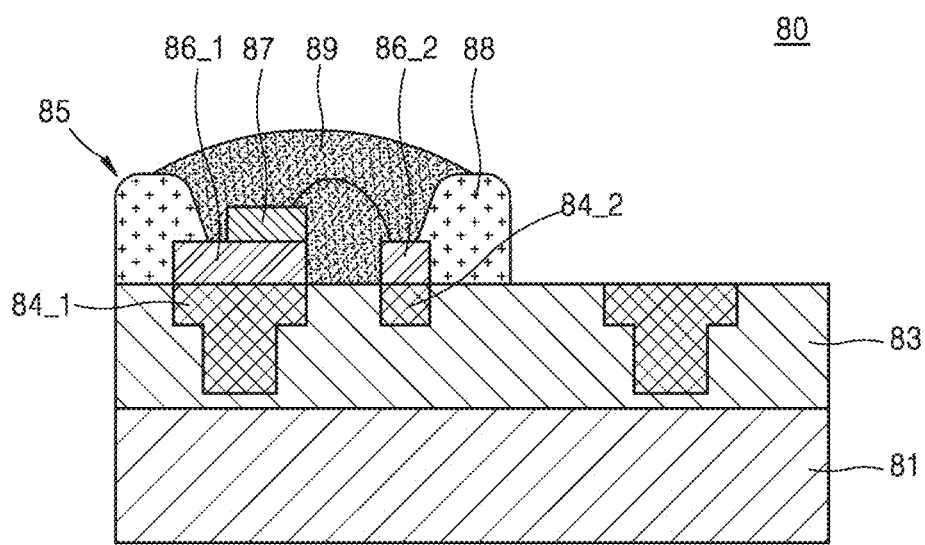

In another embodiment, as illustrated in FIG. 8, a circuit board 80 includes an insulation resin 83 that is coated on a metal substrate 81, circuit patterns 84_1 and 84_2 that are formed in the insulation resin 83, and an LED chip that is mounted to be electrically connected with the circuit patterns 84_1 and 84_2. Here, the insulation resin 83 having a thickness that is equal to or less than 200 μm may be laminated as a solid-state film on a metal substrate, or may be coated in a liquid state on the metal substrate by using spin coating or a molding method using a blade. A size of an insulation resin layer having an insulation circuit pattern may be equal to or less than a size of the metal substrate. Also, the circuit patterns 84_1 and 84_2 are formed in a manner in which a metal material such as copper is filled in shapes of the circuit patterns 84_1 and 84_2 that are engraved in the insulation resin 83.

Referring to FIG. 8, an LED module 85 includes an LED chip 87, LED electrodes 86_1 and 86_2, a plastic molding case 88, and a lens 89.

Referring back to FIG. 1, fiducial marks Mk1 and Mk2 may be provided on the substrate 110 and may be used as references to mount various electronic devices on the substrate 110. Referring to FIG. 1, two fiducial marks Mk1 and Mk2 are provided, but three or more fiducial marks may be used or only one fiducial mark may be used.

The fiducial marks Mk1 and Mk2 may be used to determine an arbitrary position on a spatial coordinate axis when an x-axis is defined as a straight line that links the fiducial marks Mk1 and Mk2, an y-axis is defined as a line perpendicularly crossing the x-axis on a planar surface of the substrate 110, and a z-axis is defined as a perpendicular line on the planar surface of the substrate 110.

The light-emitting package 120 may be positioned on the substrate 110 so as to be disposed at a predetermined target position T with reference to the fiducial marks Mk1 and Mk2. However, due to various factors that occur in a manufacturing procedure, e.g., a tolerance, vibration in the manufacturing procedure, a limit of a mechanical accuracy, or other unexpected factors, an actual position of the light-emitting package 120 may be deviated from the target position T.

Power terminals 111 may be arranged at a side or both sides of the substrate 110 so as to supply a power to various electronic apparatuses to be arranged on the substrate 110. Also, the substrate 110 may be configured to allow a power to be supplied to the light-emitting package 120 via the power terminals 111.

In one or more embodiments, the light-emitting package 120 may include the light-emitting device 124 and a package frame 126 for accommodating the light-emitting device 124. The package frame 126 may have a window 122 via which the light-emitting device 124 emits light.

An edge of the window 122 may have a polygonal shape such as a quadrangular shape, or an oval shape, and in the present embodiment, the edge of the window 122 may have a round shape. For example, the light-emitting package 120 may have the round window 122, and a position of the light-emitting package 120 may be represented by a center C1 of the window 122.

The light extraction lens 130 whose diameter is equal to or greater than a diameter of the window 122 may be arranged on the light-emitting package 120. A target position for disposing the light extraction lens 130 may be equal to the target position T of the light-emitting package 120. The target position of the light extraction lens 130 may be set so that a center C2 of the light extraction lens 130 coincides with an optical axis of the light-emitting package 120. For example, the target position of the light extraction lens 130 may be arranged to allow the center C2 of the light extraction lens 130 to be disposed at a same position as the center C1 of the window 122.

As will be described later, a filling material may be filled in the window 122, and a phosphor may not exist in the filling material. If the phosphor does not exist in the filling material in the window 122, when an inspection is performed according to the related art, light emission cannot be induced from the light-emitting package 120 simply by irradiating an arbitrary light to the light-emitting package 120, such that it is difficult to recognize an exact position of the light-emitting package 120.

In one embodiment, the light-emitting device 124 may be formed of an LED chip. The LED chip may emit blue light, green light, or red light, according to a type of a compound semiconductor constituting the LED chip. Alternatively, the LED chip may emit ultraviolet (UV) rays. In another embodiment, the light-emitting device 124 may be formed of an UV light diode chip, a laser diode chip, or an organic light-emitting device (OLED) chip. However, according to one or more embodiments of the inventive concept, the light-emitting device 124 may be formed of various light devices other than the aforementioned elements.

The light-emitting package 120 may be configured so that a Color Rendering Index (CRI) can be adjusted from a sodium lamp level (CRI=40) to a solar level (CRI=100) and also may generate a variety of white light in the color temperature range between from about 2,000K to about 20,000K, and when required, the light-emitting package 120 may adjust a lighting color according to the ambient atmosphere or mood by generating visible light having a purple, blue, green, red, or orange color, or infrared light. Also, the light-emitting package 120 may generate light having a special wavelength capable of promoting growth of plants.

Figure 9:
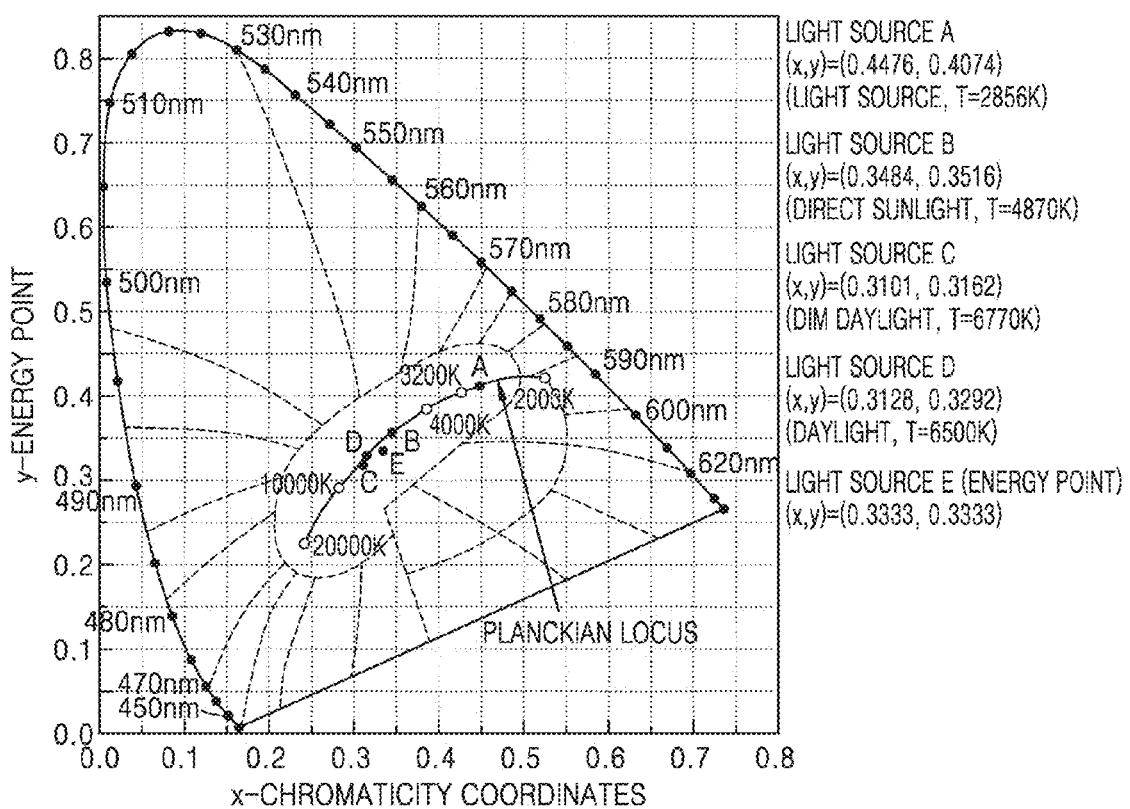
FIG. 9 illustrates a color temperature spectrum related to light that is emitted from a light-emitting device of the light-emitting apparatus, according to an exemplary embodiment of the inventive concept.

White light that corresponds to a combination of light emitted by the blue-light LED and light emitted by the yellow, green, and red phosphors and/or green and red light-emitting devices may have at least two peak wavelengths and may be positioned in a region defined by (x, y) coordinates (0.4476, 0.4074), (0.3484, 0.3516), (0.3101, 0.3162), (0.3128, 0.3292), and (0.3333, 0.3333) of a CIE 1931 coordinate system. Alternatively, the white light may be positioned in a region that is surrounded by the line segment and a black body radiation spectrum. A color temperature of the white light may be between about 2,000K and about 20,000K. FIG. 9 illustrates a color temperature (i.e., a Planckian spectrum).

In order to protect the light-emitting device 124 against an external environment or to improve an extraction efficiency of light that is externally emitted from the light-emitting device 124, a light-transmitting material as a filling material may be arranged on the light-emitting device 124.

Here, the light-transmitting material may be a transparent organic material including epoxy, silicone, a hybrid of epoxy and silicone, or the like, and may be used after being hardened via heating, light irradiation, a time-elapse, or the like.

With respect to silicone, polydimethyl siloxane is classified into a methyl-base, and polymethylphenyl siloxane is classified into a phenyl-base, and depending on the methyl-base and the phenyl-base, silicone differs in refractive index, water-permeation rate, light transmittance, light stability, and heat-resistance. Also, silicone differs in hardening time according to a cross linker and a catalyst, thereby affecting distribution of the phosphors.

The light extraction efficiency varies according to a refractive index of the filling material. In order to minimize a difference between a refractive index of an outermost medium of emitted blue light of the LED chip and a refractive index of the blue light that is emitted to the outside air, at least two types of silicone having different refractive indexes may be sequentially stacked.

In general, the methyl-base silicone has the most excellent heat-resistance, and variation due to a temperature increase is decreased in order of the phenyl-base, the hybrid, and epoxy. Silicone may be divided into a gel type, an elastomer type, and a resin type according to a hardness level.

The light extraction lens 130 may be additionally arranged on the light-emitting package 120 so as to radially guide light that is irradiated from the light-emitting device 124, and in this regard, the light extraction lens 130 may be a pre-made lens that is attached on the light-emitting package 120 or may be formed by injecting a liquid organic solvent into a molding frame in which the light-emitting device 124 is mounted and then by hardening it.

The light extraction lens 130 may be directly attached on the filling material on the LED chip or may be separated from the filling material by being mounted on an outer side of the light-emitting package 120. The liquid organic solvent may be injected into the molding frame via injection molding, transfer molding, compression molding, or the like.

According to a shape (e.g., a concave shape, a convex shape, a concave-convex shape, a conical shape, a geometrical shape, or the like) of the lens, the light distribution characteristic of the light-emitting device may vary, and the shape of the lens may be changed according to requirements for the light efficiency and the light distribution characteristic.

The light-emitting device 124 may be formed of a semiconductor such as a nitride semiconductor. The nitride semiconductor may be represented by the general formula $Al_xGa_yIn_zN$ ($0 \le x \le 1$, $0 \le y \le 1$, $0 \le z \le 1$, $x+y+z=1$). The light-emitting device 124 may be formed by epitaxially growing the nitride semiconductor such as GaN, InN, MN, InGaN, AlGaN, or InGaAlN on a substrate by using a vapor-phase growing method such as an MOCVD method. Also, the light-emitting device 124 may be formed of a semiconductor such as Si, ZnO, ZnS, ZnSe, SiC, GaP, GaAlAs, or AlInGaP, graphene, or an OLED as well. The semiconductor may have a stack structure in which an n-type semiconductor layer, an emission layer, and a p-type semiconductor layer are orderly stacked. The emission layer (i.e., an active layer) may be a stack semiconductor having a multi-quantum well structure, a uni-quantum well structure, or a double-hetero structure. The light-emitting device 124 may emit blue light but is not limited thereto. The light-emitting device 124 may be set to emit light with a random wavelength.

The light-emitting device 124 may be formed as the LED chip having one of various structures or may be formed as an LED package including the LED chips and having one of various forms. Hereinafter, various types of the LED chip and the LED package that may be employed in light source packages according to one or more embodiments of the inventive concept will be described in detail.

<LED Chip—First Embodiment>

Figure 10:
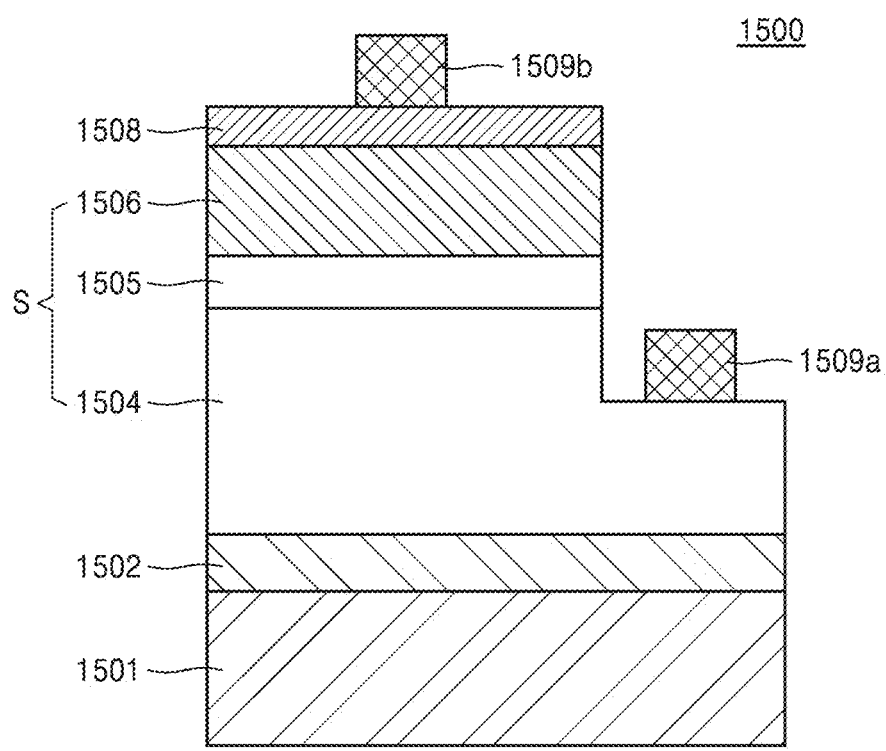
FIGS. 10 through 12 are cross-sectional side views of light-emitting diode (LED) chips used in a lighting apparatus, according to exemplary embodiments of the inventive concept.

FIG. 10 is a cross-sectional side view of an LED chip 1500 that may be used as the light-emitting device 124 in the light-emitting package 120, according to an exemplary embodiment of the inventive concept.

As illustrated in FIG. 10, the LED chip 1500 includes an emission stack S that is formed on a substrate 1501. The emission stack S includes a first conductive semiconductor layer 1504, an active layer 1505, and a second conductive semiconductor layer 1506.

Also, the emission stack S includes an ohmic electrode layer 1508 formed on the second conductive semiconductor layer 1506, and a first electrode 1509a and a second electrode 1509b are formed on top surfaces of the first conductive semiconductor layer 1504 and the ohmic contact layer 1508, respectively.

Throughout the specification, terms such as 'upper', 'top surface', 'lower', 'bottom surface', 'side surface', or the like are based on the drawings; thus, they may be changed according to a direction in which a device is actually disposed.

Hereinafter, major elements of the LED chip 1500 are described in detail.

According to necessity, the substrate 1501 may be formed of an insulating substrate, a conductive substrate, or a semiconductor substrate. For example, the substrate 1501 may be formed of sapphire, SiC, Si, $MgAl_2O_4$, MgO, $LiAlO_2$, $LiGaO_2$, or GaN. For an epitaxial growth of a GaN material, it is preferable to use a GaN substrate that is a homogeneous substrate; however, the GaN substrate has a high production cost due to difficulty in its manufacture.

An example of a heterogeneous substrate includes a sapphire substrate, a silicon carbide (SiC) substrate, or the like, and in this regard, the sapphire substrate is used more than the SiC substrate, which is expensive. When the heterogeneous substrate is used, a defect such as dislocation or the like is increased due to a difference between lattice constants of a substrate material and a grown thin-film material. Also, due to a difference between thermal expansion coefficients of the substrate material and the grown thin-film material, the substrate 1501 may be bent when a temperature is changed, and the bend causes a crack of a grown thin-film. The aforementioned problem may be decreased by using a buffer layer 1502 between the substrate 1501 and the emission stack S that includes a GaN material.

In order to improve an optical or electrical characteristic of the LED chip 1500 before or after an LED structure growth, the substrate 1501 may be completely or partly removed or may be patterned while a chip is manufactured.

For example, the sapphire substrate may be separated in a manner in which a laser is irradiated to an interface between the sapphire substrate and a semiconductor layer, and a silicon substrate or the SiC substrate may be removed by using a polishing method, an etching method, or the like.

When the substrate 1501 is removed, another supporting substrate may be used, and the supporting substrate may be bonded to the other side of an original growth substrate by using a reflective metal material or may be formed by inserting a reflection structure into an adhesion layer, so as to improve an optical efficiency of the LED chip 1500.

A patterning operation on a substrate is performed by forming an uneven or slope surface on a main side (e.g., a top surface or both surfaces) or side surfaces of the substrate before or after a growth of an LED structure, and by doing so, a light extraction efficiency is improved. A size of a pattern may be selected in a range from 5 nm to 500 μm, and in order to improve the light extraction efficiency, a regular pattern or an irregular pattern may be selected. In addition, a shape of the pattern may be a column, a cone, a hemisphere, a polygonal shape, or the like.

The sapphire substrate includes crystals having a hexagonal-rhombohedral (Hexa-Rhombo R3c) symmetry in which lattice constants of the crystal in c-axial and a-lateral directions are 13.001 and 4.758, respectively, and the crystal has a C (0001) plane, an A (1120) plane, an R (1102) plane, or the like. In this case, the C (0001) plane easily facilitates the growth of a nitride thin-film, and is stable at a high temperature, so that the sapphire substrate including a crystal having the C (0001) plane is commonly used as a substrate for the growth of nitride.

The substrate is formed as a Si substrate that is more appropriate for a large diameter and has a relatively low price, so that mass production may be improved. However, since the Si substrate having a (111) plane as a substrate surface has a lattice constant difference of about 17% with GaN, a technology is required to suppress occurrence of a defective crystal due to the lattice constant difference. In addition, a thermal expansion difference between silicon and GaN is about 56%, so that a technology is required to suppress wafer bend caused due to the thermal expansion difference. Due to the wafer bend, a GaN thin-film may have a crack, and it may be difficult to perform a process control such that dispersion of emission wavelength in a same wafer may be increased.

Since the Si substrate absorbs light that is generated in a GaN-based semiconductor, an external quantum efficiency of the light-emitting device 10 may deteriorate, so that, the Si substrate is removed when required, and a supporting substrate such as Si, Ge, SiAl, ceramic, or metal substrates including a reflective layer may be additionally formed and then may be used.

When the GaN thin-film is grown on a heterogeneous substrate such as the Si substrate, a dislocation density may be increased due to a mismatch between lattice constants of a substrate material and a thin-film material, and the crack and the bend may occur due to the thermal expansion difference. In order to prevent the dislocation and the crack of the emission stack S, the buffer layer 1502 is disposed between the substrate 1501 and the emission stack S. The buffer layer 1502 decreases the dispersion of the emission wavelength of the wafer by adjusting a bending level of the substrate while the active layer is grown.

The buffer layer 1502 may be formed of $Al_xIn_yGa_{(1-x-y)}N$ ($0 \leq x \leq 1$, $0 \leq y \leq 1$, $0 \leq x+y \leq 1$), in particular, GaN, AlN, AlGaN, InGaN, or InGaNAlN, and when required, the buffer layer 1502 may be formed of ZrB2, HfB2, ZrN, HfN, TiN, or the like. Also, the buffer layer 1502 may be formed by combining a plurality of layers or by gradually varying composition of one of the aforementioned materials.

Since the Si substrate and the GaN thin-film has the large thermal expansion difference, when the GaN thin-film is grown on the Si substrate, the GaN thin-film is grown at a high temperature and then is cooled at a room temperature, and at this time, a tensile stress may be applied to the GaN thin-film due to the thermal expansion difference between the Si substrate and the GaN thin-film, such that a crack in the GaN thin-film may easily occur. In order to prevent the crack, a compressive stress may be applied to the GaN thin-film while the GaN thin-film is grown, so that the tensile stress may be compensated.

Due to the lattice constant difference between the Si substrate and the GaN thin-film, the Si substrate may be defective. When the Si substrate is used, a buffer layer having a composite structure is used so as to simultaneously perform a defect control and a stress control to suppress the bend.

In order to prevent reaction between Si and Ga, it is required to use a material that does not contain Ga. For example, AlN is first formed on the substrate 1501. Alternatively, not only AlN but also SiC may be used. AlN is grown by using Al and N sources at a temperature between 400 through 1300° C. When required, an AlGaN intermediate layer may be inserted into a plurality of AlN layers so as to control a stress.

The emission stack S having a multi-layer structure of the group-III nitride semiconductor is now described in detail. The first and second conductive semiconductor layers 1504 and 1506 may be formed of semiconductors that are doped with n-type and p-type impurities, respectively, or vice versa. For example, each of the first and second conductive semiconductor layers 1504 and 1506 may be formed of, but is not limited to, the group-III nitride semiconductor, e.g., a material having a composition of $Al_xIn_yGa_{(1-x-y)}N$ ($0 \leq x \leq 1$, $0 \leq y \leq 1$, $0 \leq x+y \leq 1$). In another embodiment, each of the first and second conductive semiconductor layers 1504 and 1506 may be formed of a material including an AlGaInP-based semiconductor, an AlGaAs-based semiconductor, or the like.

Each of the first and second conductive semiconductor layers 1504 and 1506 may have a single-layer structure. However, when required, each of the first and second conductive semiconductor layers 1504 and 1506 may have a multi-layer structure including a plurality of layers having different compositions or thicknesses. For example, each of the first and second conductive semiconductor layers 1504 and 1506 may have a carrier injection layer capable of improving an efficiency of electron and hole injection, and may also have a superlattice structure having various forms.

The first conductive semiconductor layer 1504 may further include a current diffusion layer (not shown) that is adjacent to the active layer 1505. The current diffusion layer may have a structure in which a plurality of $In_xAl_yGa_{(1-x-y)}N$ layers having different compositions or different impurity ratios are repeatedly stacked, or may be partially formed of an insulating material layer.

The second conductive semiconductor layer 1506 may further include an electron block layer that is adjacent to the active layer 1505. The electron block layer may have a structure in which a plurality of $In_xAl_yGa_{(1-x-y)}N$ layers having different compositions are stacked or may have at least one layer formed of $Al_yGa_{(1-y)}N$. Since the electron block layer has a bandgap greater than that of the active layer 1505, the electron block layer prevents electrons from entering to the second conductive semiconductor layer 1506 (that is a p-type).

The emission stack S may be formed by using an MOCVD apparatus. In more detail, the emission stack S is formed in a manner in which a reaction gas such as an organic metal compound gas (e.g., trimethylgallium (TMG), trimethylaluminum (TMA), or the like) and a nitrogen containing gas (e.g. ammonia (NH3) or the like) are injected into a reaction container in which the substrate 1501 is arranged and the substrate 1501 is maintained at a high temperature of about 900 through 1100° C., while a gallium-based compound semiconductor is grown on the substrate 1501, if required, an impurity gas is injected, so that the gallium-based compound semiconductor is stacked as an undoped-type, an n-type, or a p-type. Si is well known as n-type impurity. Zn, Cd, Be, Mg, Ca, Ba, or the like, in particular, Mg and Zn, may be used as p-type impurity.

The active layer 1505 that is disposed between the first and second conductive semiconductor layers 1504 and 1506 may have a multi-quantum well (MQW) structure in which a quantum well layer and a quantum barrier layer are alternately stacked. For example, in a case of a nitride semiconductor, the active layer 1505 may have a GaN/InGaN structure. However, in another embodiment, the active layer 1505 may have a single-quantum well (SQW) structure.

The ohmic electrode layer 1508 may decrease an ohmic contact resistance by relatively increasing an impurity density, so that the ohmic electrode layer 1508 may decrease an operating voltage and may improve a device characteristic. The ohmic electrode layer 1508 may be formed of GaN, InGaN, ZnO, or a graphene layer.

The first electrode 1509a or the second electrode 1509b may include a material such as Ag, Ni, Al, Rh, Pd, Ir, Ru, Mg, Zn, Pt, Au, or the like, or may have a multi-layer structure including Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like.

While the LED chip 1500 shown in FIG. 10 has a structure in which the first electrode 1509a, the second electrode 1509b, and a light extraction surface face the same side, the LED chip 1500 may have various structures such as a flip-chip structure in which the first electrode 1509a and the second electrode 1509b face the opposite side of the light extraction surface, a vertical structure in which the first electrode 1509a and the second electrode 1509b are formed on opposite surfaces, and a vertical and horizontal structure employing an electrode structure in which a plurality of vias are formed in a chip so as to increase an efficiency of current distribution and heat dissipation.

<LED Chip—Second Embodiment>

Figure 11:
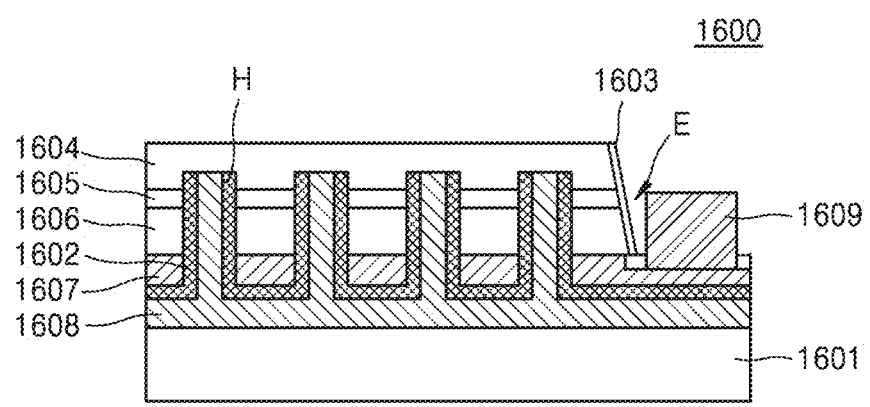

FIG. 11 illustrates an LED chip 1600 having a structure useful for increasing an efficiency of current distribution and heat dissipation, when a large area light-emitting device chip for a high output for a lighting apparatus is manufactured, according to another exemplary embodiment of the inventive concept.

As illustrated in FIG. 11, the LED chip 1600 includes a first conductive semiconductor layer 1604, an active layer 1605, a second conductive semiconductor layer 1606, a second electrode layer 1607, an insulating layer 1602, a first electrode layer 1608, and a substrate 1601. Here, in order to be electrically connected to the first conductive semiconductor layer 1604, the first electrode layer 1608 includes one or more contact holes H that are electrically insulated from the second conductive semiconductor layer 1606 and the active layer 1605 and that extend from a surface of the first electrode layer 1608 to a portion of the first conductive semiconductor layer 1604.

The contact hole H extends from an interface of the first electrode layer 1608 to an inner surface of the first conductive semiconductor layer 1604 via the second conductive semiconductor layer 1606 and the active layer 1605. The contact hole H extends to an interface between the active layer 1605 and the first conductive semiconductor layer 1604, and more preferably, the contact hole H extends to the portion of the first conductive semiconductor layer 1604. Since the contact hole H functions to perform electrical connection and current distribution of the first conductive semiconductor layer 1604, the contact hole H achieves its purpose when the contact hole H contacts the first conductive semiconductor layer 1604, thus, it is not required for the contact hole to extend to an outer surface of the first conductive semiconductor layer 1604.

The second electrode layer 1607 that is formed on the second conductive semiconductor layer 1606 may be formed of a material selected from the group consisting of Ag, Ni, Al, Rh, Pd, Ir, Ru, Mg, Zn, Pt, and Au, in consideration of a light reflection function and an ohmic contact with the second conductive semiconductor layer 1606, and may be formed via a sputtering process or a deposition process.

The contact hole H has a shape that penetrates through the second electrode layer 1607, the second conductive semiconductor layer 1606, and the active layer 1605, so as to be connected with the first conductive semiconductor layer 1604. The contact hole H may be formed via an etching process using ICP-RIE or the like.

The insulating layer 1602 is formed to cover side walls of the contact hole H and a top surface of the second conductive semiconductor layer 1606. In this case, a portion of the first conductive semiconductor layer 1604 that corresponds to a bottom surface of the contact hole H may be exposed. The insulating layer 1602 may be formed by depositing an insulating material such as $SiO_2$, $SiO_xN_y$, $Si_xN_y$, or the like. The insulating layer 1602 may be deposited with a thickness range from about 0.01 μm to about 3 μm at a temperature of 500° C. or less via a CVD process.

The second electrode layer 1607 that includes a conductive via formed by filling a conductive material is formed in the contact hole H. A plurality of the vias may be formed in a light-emitting device region. The number of vias and a contact area of the vias may be adjusted so that an area of the vias that contact a first conductive-type semiconductor is within a range between about 1% and about 5% of an area of the light-emitting device region. A planar radius of the area of the vias that contact the first conductive-type semiconductor is within a range between about 5 μm and about 50 μm, and the number of vias may be between 1 and 300 for each light-emitting device region, according to an area of each light-emitting device region. Although the number of vias may vary according to the area of each light-emitting device region, the number of vias may be at least 3. A distance between the vias may correspond to a matrix array of rows and columns in the range between about 100 μm and about 500 μm, and in more detail, in the range between about 150 μm and about 450 μm. When the distance between the vias is less than about 100 μm, the number of vias is increased so that an emission area is relatively decreased such that an emission efficiency deteriorates. When the distance is greater than about 500 μm, a current spread may be difficult such that an emission efficiency may deteriorate. A depth of the contact hole H may vary according to a second semiconductor layer and an active layer and may be in the range between about 0.5 μm and about 5.0 μm.

Afterward, the substrate 1601 is formed on a surface of the first electrode layer 1608. In this structure, the substrate 1601 may be electrically connected to the first conductive semiconductor layer 1604 via the conductive via that contacts the first conductive semiconductor layer 1604.

The substrate 1601 may be formed of a material selected from the group consisting of Au, Ni, Al, Cu, W, Si, Se, GaAs, SiAl, Ge, SiC, MN, $Al_2O_3$, GaN, and AlGaN, via a plating process, a sputtering process, a deposition process, or an adhesion process. However, a material and a forming method with respect to the substrate 1601 are not limited thereto.

In order to decrease a contact resistance of the contact hole H, a total number of contact holes H, a shape of the contact hole H, a pitch of the contact hole H, a contact area of the contact hole H with respect to the first and second conductive semiconductor layers 1604 and 1606, or the like may be appropriately adjusted, and since the contact holes H are arrayed in various forms along rows and columns, a current flow may be improved.

<LED Chip—Third Embodiment>

Since an LED lighting apparatus provides an improved heat dissipation characteristic, it is preferable to apply an LED chip having a small calorific value to the LED lighting apparatus, in consideration of a total heat dissipation performance. An example of the LED chip may be an LED chip having a nano structure (hereinafter, referred to as a "nano LED chip").

An example of the nano LED chip includes a core-shell type nano LED chip. The core-shell type nano LED chip generates a relatively small amount of heat due to its small combined density, and increases its emission area by using the nano structure so as to increase emission efficiency. Also, the core-shell type nano LED chip may obtain a non-polar active layer, thereby preventing efficiency deterioration due to polarization, so that a droop characteristic may be improved.

Figure 12:
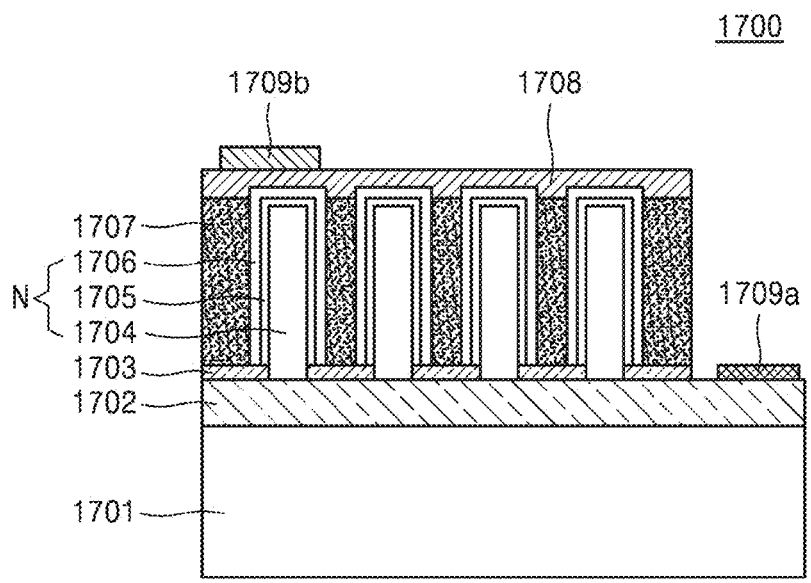

FIG. 12 illustrates a nano LED chip 1700 that may be applied to the lighting apparatus 100, according to another exemplary embodiment of the inventive concept.

As illustrated in FIG. 12, the nano LED chip 1700 includes a plurality of nano emission structures N that are formed on a substrate 1701. In the present embodiment, the nano emission structure N has a rod structure as a core-shell structure, but in another embodiment, the nano emission structure N may have a different structure such as a pyramid structure.

The nano LED chip 1700 includes a base layer 1702 formed on the substrate 1701. The base layer 1702 may be a layer to provide a growth surface for the nano emission structures N and may be formed of a first conductive semiconductor. A mask layer 1703 formed of at least one layer and having open areas for a growth of the nano emission structures N (in particular, a core) may be formed on the base layer 1702. The mask layer 1703 may be formed of a dielectric material such as $SiO_2$ or SiNx.

In the nano emission structure N, a first conductive nano core 1704 is formed by selectively growing the first conductive semiconductor through the open areas of the mask layer 1703, and an active layer 1705 and a second conductive semiconductor layer 1706 are formed as a shell layer on a surface of the first conductive nano core 1704 that is exposed after the mask layer 1703 formed of at least one layer is partially etched and removed. By doing so, the nano emission structure N may have a core-shell structure in which the first conductive semiconductor is a nano core, and the active layer 1705 and the second conductive semiconductor layer 1706 that surround the nano core are the shell layer.

In the present embodiment, the nano LED chip 1700 includes a filling material 1707 that fills gaps between the nano emission structures N. The filling material 1707 may structurally stabilize the nano emission structures N. The filling material 1707 may include, but is not limited to, a reflective material or a transparent material such as $SiO_2$. An ohmic contact layer 1708 may be formed on the nano emission structure N and/or may be formed to surround the second conductive semiconductor layer 1706 so as to contact the second conductive semiconductor layer 1706. The nano LED chip 1700 includes first and second electrodes 1709*a* and 1709*b* that contact the base layer 1702, which is formed of the first conductive semiconductor, and the ohmic contact layer 1708, respectively.

By varying a diameter, a component, or a doping density of the nano emission structures N, light having at least two different wavelengths may be emitted from one device. By appropriately adjusting the light having the different wavelengths, white light may be realized in the one device without using a phosphor. In addition, by combining the one device with another LED chip or combining the one device with a wavelength conversion material such as a phosphor, light having desired various colors or white light having different color temperatures may be realized.

<LED Chip—Additional Embodiment>

An LED chip having one of various structures may be used, other than the aforementioned LED chips. For example, it is possible to use an LED chip having a light extraction efficiency that is significantly improved by interacting a quantum well exciton and surface-plasmon polaritons (SPP) formed at an interface between metal and dielectric layers of the LED chip.

<LED Package>

The aforementioned various LED chips may be mounted as bare chips on a circuit board and then may be used in a lighting apparatus. However, unlike this, the LED chips may be also alternatively used in various package structures that are mounted in a package body having a pair of electrodes.

A package including the LED chip (hereinafter, referred to as an LED package) may have not only an external terminal structure that is easily connected to an external circuit but also may have a heat dissipation structure for improvement of a heat dissipation characteristic of the LED chip and various optical structures for improvement of a light characteristic of the LED chip. For example, the various optical structures may include a wavelength conversion unit that converts light emitted from the LED chip into light having a different wavelength, or may include a lens structure for improvement of a light distribution characteristic of the LED chip.

<Example of LED Package>

Figure 13:
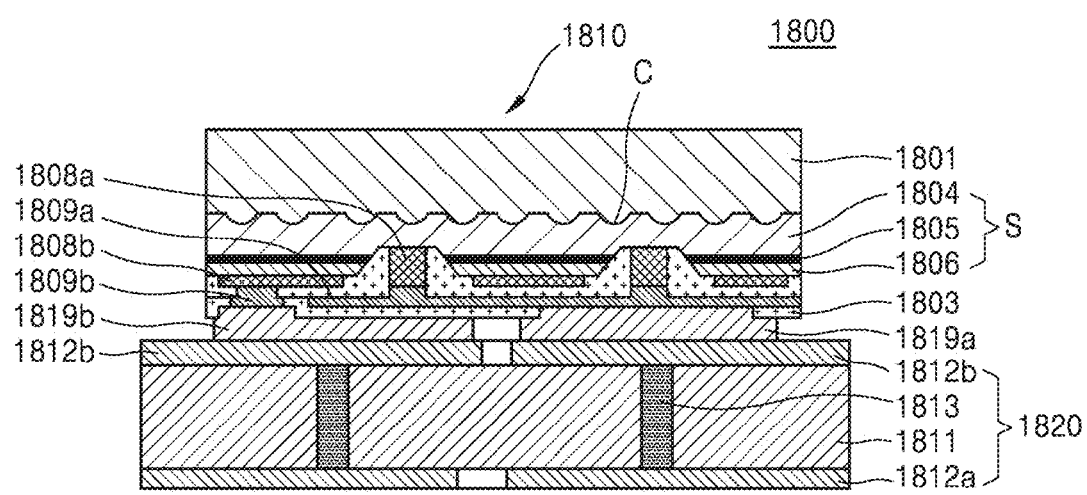
FIGS. 13 and 14 are cross-sectional side views of LED packages including LED chips used in the lighting apparatus, according to exemplary embodiments of the inventive concept.

FIG. 13 illustrates a semiconductor light-emitting device 1800 that is a light source to be applied to a light source package and that includes an LED chip 1810 mounted on a mounting substrate 1820, according to an exemplary embodiment of the inventive concept.

The semiconductor light-emitting device 1800 shown in FIG. 13 includes the mounting substrate 1820 and the LED chip 1810 that is mounted on the mounting substrate 1820. The LED chip 1810 is different from the LED chips in the aforementioned embodiments.

The LED chip 1810 includes an emission stack S that is disposed on a surface of the substrate 1801, and first and second electrodes 1808*a* and 1808*b* that are disposed on the other surface of the substrate 1801 with respect to the emission stack S. Also, the LED chip 1810 includes an insulating unit 1803 to cover the first and second electrodes 1808*a* and 1808*b*.

The first and second electrodes 1808*a* and 1808*b* may be connected to first and second electrode pads 1819*a* and 1819*b* via first and second electric power connection units 1809*a* and 1809*b*.

The emission stack S may include a first conductive semiconductor layer 1804, an active layer 1805, and a second conductive semiconductor layer 1806 that are sequentially disposed on the substrate 1801. The first electrode 1808*a* may be provided as a conductive via that contacts the first conductive semiconductor layer 1804 by penetrating through the second conductive semiconductor layer 1806 and the active layer 1805. The second electrode 1808*b* may contact the second conductive semiconductor layer 1806.

A plurality of the vias may be formed in a light-emitting device region. The number of vias and a contact area of the vias may be adjusted so that an area of the vias that contact a first conductive-type semiconductor is within a range between about 1% and about 5% of an area of the light-emitting device region. A planar radius of the area of the vias that contact the first conductive-type semiconductor is within a range between about 5 μm and about 50 μm, and the number of vias may be between 1 and 300 vias for each light-emitting device region, according to an area of each light-emitting device region. Although the number of vias may vary according to the area of each light-emitting device region, the number of vias may be at least 3. A distance between the vias may correspond to a matrix array of rows and columns in the range between about 100 μm and about 500 μm, and in more detail, in the range between about 150 μm and about 450 μm. When the distance between the vias is less than about 100 μm, the number of vias is increased so that an emission area is relatively decreased such that an emission efficiency deteriorates. However, when the distance is greater than about 500 μm, a current spread may be difficult such that an emission efficiency may deteriorate. A depth of the contact hole H may vary according to a second semiconductor layer and an active layer and may be in the range between about 0.5 μm and about 5.0 μm.

A conductive ohmic material is deposited on the emission stack S so that the first and second electrodes 1808*a* and 1808*b* are formed. The first electrode 1808*a* and/or the second electrode 1808*b* may be an electrode including at least one material selected from the group consisting of Ag, Al, Ni, Cr, Cu, Au, Pd, Pt, Sn, Ti, W, Rh, Ir, Ru, Mg, Zn, and an alloy thereof. For example, the second electrode 1808*b* may be formed as an ohmic electrode including an Ag layer deposited with respect to the second conductive semiconductor layer 1806. The Ag-ohmic electrode functions to reflect light. Selectively, a single layer including Ni, Ti, Pt, or W or a layer of an alloy thereof may be alternately stacked on the Ag layer. In more detail, a Ni/Ti layer, a TiW/Pt layer, or a Ti/W layer may be stacked below the Ag layer or the aforementioned layers may be alternately stacked below the Ag layer.

The first electrode 1808*a* may be formed in a manner that a Cr layer may be stacked with respect to the first conductive semiconductor layer 1804 and then Au/Pt/Ti layers may be sequentially stacked on the Cr layer, or an Al layer may be stacked with respect to the second conductive semiconductor layer 1806 and then Ti/Ni/Au layers may be sequentially stacked on the Al layer.

In order to improve an ohmic characteristic or a reflective characteristic, the first and second electrodes 1808*a* and 1808*b* may be formed of various materials or may have various stacking structures, other than the aforementioned materials and structures.

The insulating unit 1803 may have an open area to expose a portion of the first and second electrodes 1808*a* and 1808*b*, and the first and second electrode pads 1819*a* and 1819*b* may contact the first and second electrodes 1808*a* and 1808*b*. The insulating unit 1803 may be deposited to have a thickness between about 0.01 μm and about 3 μm via $SiO_2$ and/or SiN CVD processes at a temperature about 500° C. or less.

The first and second electrodes 1808a and 1808b may be disposed in the same direction, and as will be described later, the first and second electrodes 1808a and 1808b may be mounted in the form of a flip-chip in a lead frame. In this case, the first and second electrodes 1808a and 1808b may be disposed to face in the same direction.

In particular, the first electric power connection unit 1809a may be formed by the first electrode 1808a having a conductive via that penetrates through the active layer 1805 and the second conductive semiconductor layer 1806 and then is connected to the first conductive semiconductor layer 1804 in the emission stack S.

In order to decrease a contact resistance between the conductive via and the first electric power connection unit 1809a, a total number, shapes, pitches, a contact area with the first conductive semiconductor layer 1804, or the like of the conductive via and the first electric power connection unit 1809a may be appropriately adjusted, and since the conductive via and the first electric power connection unit 1809a are arrayed in rows and columns, a current flow may be improved.

An electrode structure of the other side of the semiconductor light-emitting device 1800 may include the second electrode 1808b that is directly formed on the second conductive semiconductor layer 1806, and the second electric power connection unit 1809b that is formed on the second electrode 1808b. The second electrode 1808b may function to form an electrical ohmic connection with the second electric power connection unit 1809b and may be formed of a light reflection material, so that, when the LED chip 1810 is mounted as a flip-chip structure, the second electrode 1808b may efficiently discharge light, which is emitted from the active layer 1805, toward the substrate 1801. Obviously, according to a major light emission direction, the second electrode 1808b may be formed of a light-transmitting conductive material such as transparent conductive oxide.

The aforementioned two electrode structures may be electrically separated from each other by using the insulating unit 1803. Any material or any object having an electrical insulation property may be used as the insulating unit 1803, but it is preferable to use a material having a low light-absorption property. For example, silicon oxide or silicon nitride such as $SiO_2$, $SiO_xN_y$, $Si_xN_y$, or the like may be used. When required, the insulating unit 1803 may have a light reflection structure in which a light reflective filler is distributed throughout a light transmitting material.

The first and second electrode pads 1819a and 1819b may be connected to the first and second electric power connection units 1809a and 1809b, respectively, and thus may function as external terminals of the LED chip 1810. For example, the first electrode pad 1819a and/or the second electrode pad 1819b may be formed of Au, Ag, Al, Ti, W, Cu, Sn, Ni, Pt, Cr, NiSn, TiW, AuSn, or a eutectic alloy thereof. In this case, when the first and second electrode pads 1819a and 1819b are mounted on the mounting substrate 1820, the first and second electrode pads 1819a and 1819b may be bonded to the mounting substrate 1820 by using eutectic metal, so that a separate solder bump that is generally used in flip-chip bonding may not be used. Compared to a case of using the solder bump, the mounting method using the eutectic metal may achieve a more excellent heat dissipation effect. In this case, in order to obtain the excellent heat dissipation effect, the first and second electrode pads 1819a and 1819b may be formed while having large areas.

The substrate 1801 and the emission stack S may be understood by referring to the aforementioned descriptions, unless contrary description is provided. Also, although not particularly illustrated, a buffer layer may be formed between the emission stack S and the substrate 1801, and in this regard, the buffer layer may be formed as a undoped semiconductor layer including nitride or the like, so that the buffer layer may decrease a lattice defect of an emission structure that is grown on the buffer layer.

The substrate 1801 may have first and second primary surfaces that face each other, and in this regard, a convex-concave structure may be formed on at least one of the first and second primary surfaces. The convex-concave structure that is arranged on one surface of the substrate 1801 may be formed of the same material as the substrate 1801 since a portion of the substrate 1801 is etched, or may be formed of a different material from the substrate 1801.

As in the present embodiment, since the convex-concave structure is formed at an interface between the substrate 1801 and the first conductive semiconductor layer 1804, a path of light emitted from the active layer 1805 may vary, such that a rate of light that is absorbed in the semiconductor layer may be decreased and a light-scattering rate may be increased; thus, the light extraction efficiency may be increased.

In more detail, the convex-concave structure may have a regular shape or an irregular shape. Heterogeneous materials that form the convex-concave structure may include a transparent conductor, a transparent insulator, or a material having excellent reflectivity. In this regard, the transparent insulator may include, but is not limited to, $SiO_2$, SiNx, $Al_2O_3$, HfO, $TiO_2$, or ZrO, the transparent conductor may include, but is not limited to, TCO such as indium oxide containing ZnO or an additive including Mg, Ag, Zn, Sc, Hf, Zr, Te, Se, Ta, W, Nb, Cu, Si, Ni, Co, Mo, Cr, or Sn, and the reflective material may include, but is not limited to, Ag, Al, or DBR that is formed of a plurality of layers having different refractive indexes.

The substrate 1801 may be removed from the first conductive semiconductor layer 1804. In order to remove the substrate 1801, a laser lift off (LLO) process using a laser, an etching process, or a grinding process may be performed. After the substrate 1801 is removed, the convex-concave structure may be formed on a top surface of the first conductive semiconductor layer 1804.

As illustrated in FIG. 13, the LED chip 1810 is mounted on the mounting substrate 1820. The mounting substrate 1820 has a structure in which upper and lower electrode layers 1812b and 1812a are formed on a top surface and a bottom surface of a substrate body 1811, respectively, and a via 1813 penetrates through the substrate body 1811 so as to connect the upper and lower electrode layers 1812b and 1812a. The substrate body 1811 may be formed of resin, ceramic, or metal, and the upper and lower electrode layers 1812b and 1812a may be metal layers including Au, Cu, Ag, Al, or the like.

Obviously, an example of a substrate on which the LED chip 1810 is mounted is not limited to the mounting substrate 1820 of FIG. 13, and thus any substrate having a wiring structure to drive the LED chip 1810 may be used. For example, it is possible to provide a package structure in which the LED chip 1810 is mounted in a package body having a pair of lead frames.

<Another Example of LED Package—Chip Scale Package (CSP)>

The example of the LED package that may be used in the lighting apparatus may include an LED chip package having a CSP structure.

The CSP may reduce a size of the LED chip package, may simplify the manufacturing process, and may be appropriate for mass production. In addition, an LED chip, wavelength conversion materials such as phosphors, and an optical structure such as a lens may be integrally manufactured, so that the CSP may be designed as appropriate for the lighting apparatus.

Figure 14:
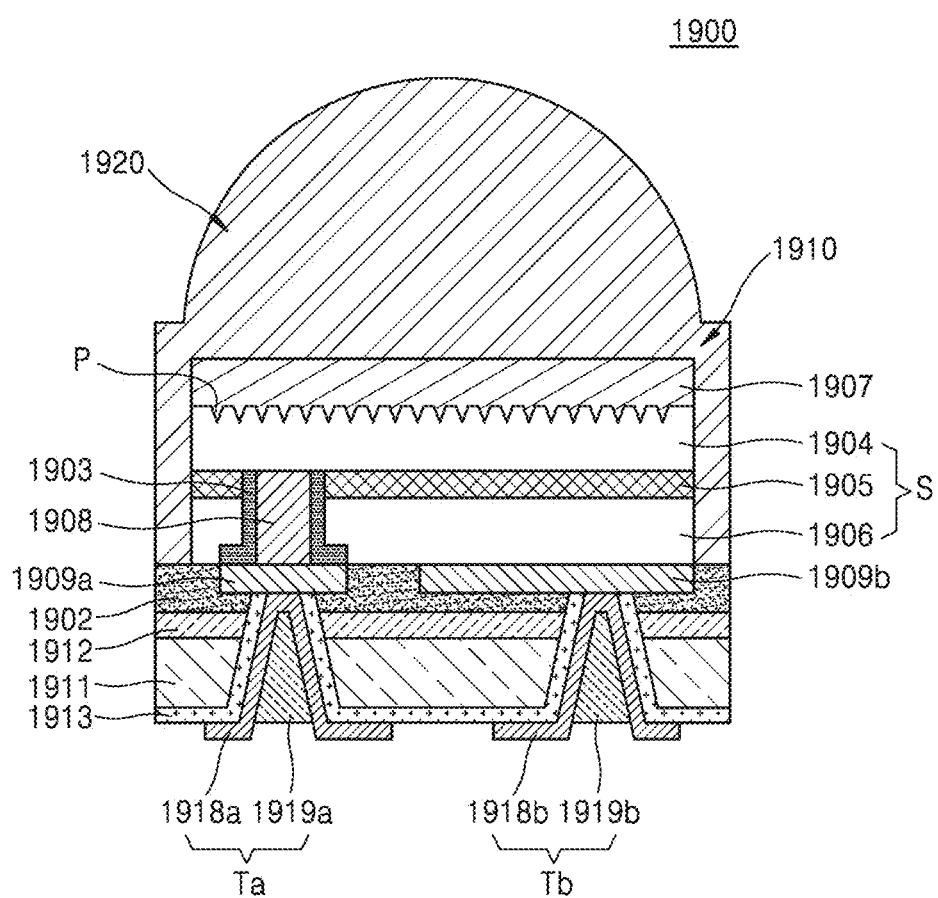

FIG. 14 illustrates an example of a CSP 1900 that has a package structure in which an electrode is formed via a bottom surface of an LED 1910 that is in an opposite direction of a primary light extraction surface, and a phosphor layer 1907 and a lens 1920 are integrally formed, according to an exemplary embodiment of the inventive concept.

The CSP 1900 shown in FIG. 14 includes an emission stack S disposed on a mounting substrate 1911, first and second terminals Ta and Tb, the phosphor layer 1907, and the lens 1920.

The emission stack S has a stack structure including first and second conductive semiconductor layers 1904 and 1906, and an active layer 1905 disposed between the first and second conductive semiconductor layers 1904 and 1906. In the present embodiment, the first and second conductive semiconductor layers 1904 and 1906 may be n-type and p-type semiconductor layers, respectively, and may be formed of a nitride semiconductor such as $Al_xIn_yGa_{(1-x-y)}N$ ($0 \le x \le 1$, $0 \le y \le 1$, $0 \le x+y \le 1$). Alternatively, the first and second conductive semiconductor layers 1904 and 1906 may be formed of a GaAs-based semiconductor or a GaP-based semiconductor, other than the nitride semiconductor.

The active layer 1905 that is disposed between the first and second conductive semiconductor layers 1904 and 1906 may emit light that has a predetermined energy due to recombination of electrons and holes and may have a MQW structure in which a quantum well layer and a quantum barrier layer are alternately stacked. The MQW structure may include an InGaN/GaN structure or an AlGaN/GaN structure.

The first and second conductive semiconductor layers 1904 and 1906, and the active layer 1905 may be formed via a semiconductor layer growing process such as MOCVD, MBE, HYPE, or the like that is well known in the art.

In the LED 1910 shown in FIG. 14, a growth substrate is already removed, and a concave-convex structure P may be formed on a surface of the LED 1910 from which the growth substrate is removed. Also, the phosphor layer 1907 is formed as a light conversion layer on the surface whereon the concave-convex structure is formed.

The LED 1910 may have first and second electrodes 1909a and 1909b that contact the first and second conductive semiconductor layers 1904 and 1906, respectively. The first electrode 1909a has a conductive via 1908 that contacts the first conductive semiconductor layer 1904 by penetrating through the second conductive semiconductor layer 1906 and the active layer 1905. An insulating layer 1903 is formed between the conductive via 1908 and the active layer 1905 and the second conductive semiconductor layer 1906, thereby preventing a short.

Although one conductive via 1908 is arranged, in another embodiment, at least two conductive vias 1908 may be arranged for improved current distribution and may be arrayed in various forms.

The mounting substrate 1911 is a supporting substrate such as a silicon substrate to be easily applied to a semiconductor procedure, but examples of the mounting substrate 1911 may vary. The mounting substrate 1911 and the LED 1910 may be bonded to each other via bonding layers 1902 and 1912. The bonding layers 1902 and 1912 may be formed of an electrically insulating material or an electrically conductive material, and in this regard, examples of the electrically insulating material may include oxide such as $SiO_2$, SiN, or the like, or resin materials including a silicon resin, an epoxy resin, or the like, and examples of the electrically conductive material may include Ag, Al, Ti, W, Cu, Sn, Ni, Pt, Cr, NiSn, TiW, AuSn, or a eutectic metal thereof. The bonding process may be performed in a manner in which the bonding layers 1902 and 1912 are arranged on bonding surfaces of the LED 1910 and the mounting substrate 1911 and then are bonded together.

A via that penetrates through the mounting substrate 1911 is formed at a bottom surface of the mounting substrate 1911 so as to contact the first and second electrodes 1909a and 1909b of the bonded LED 1910. Then, an insulator 1913 may be formed on a side surface of the via and the bottom surface of the mounting substrate 1911. When the mounting substrate 1911 is formed as a silicon substrate, the insulator 1913 may be arranged as a silicon oxide layer that is formed via a thermal oxidation process. By filling the via with a conductive material, the first and second terminals Ta and Tb are formed to be connected to the first and second electrodes 1909a and 1909b. The first and second terminals Ta and Tb may include seed layers 1918a and 1918b, and plating charging units 1919a and 1919b that are formed by using the seed layers 1918a and 1918b via a plating process.

Figure 15:
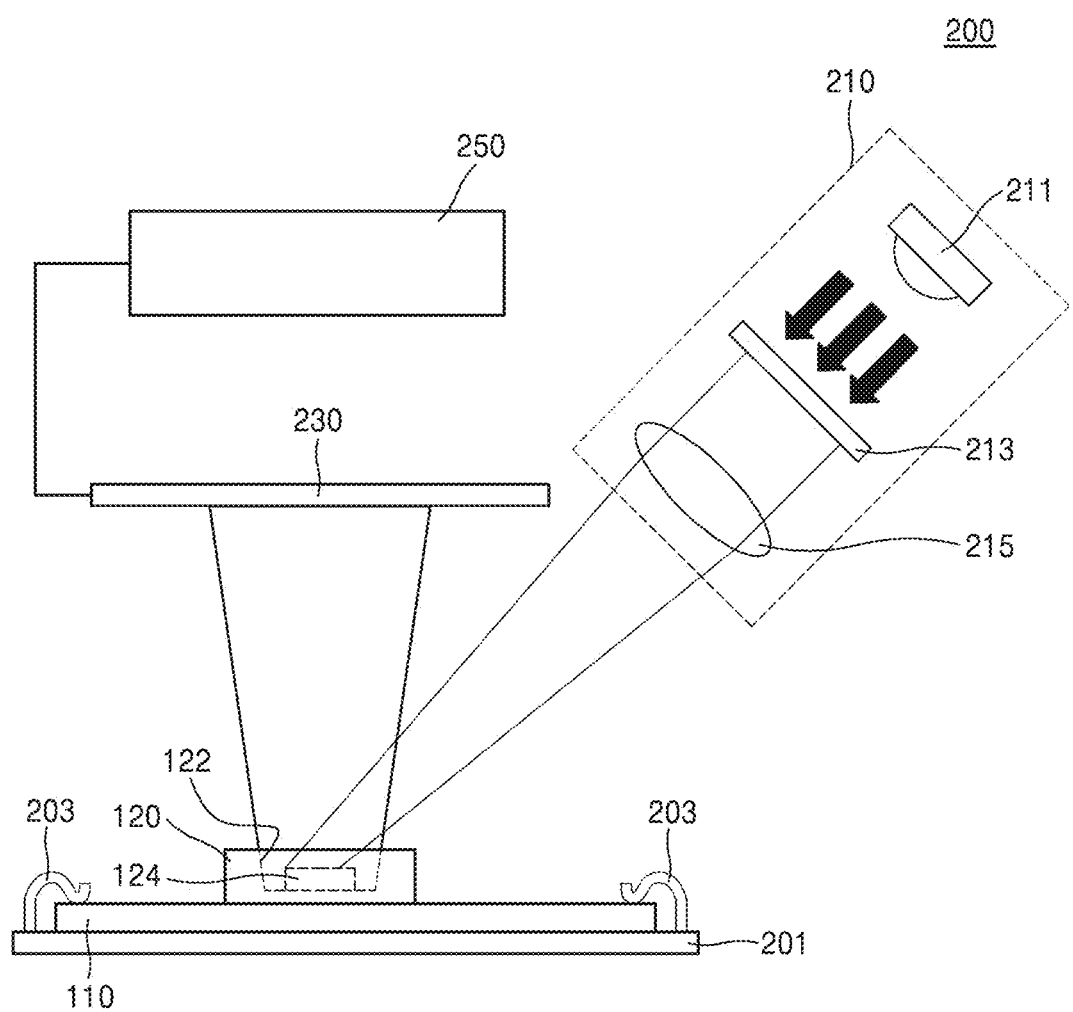
FIG. 15 illustrates a concept of a light-emitting module inspecting apparatus, according to an exemplary embodiment of the inventive concept.
Figure 16:
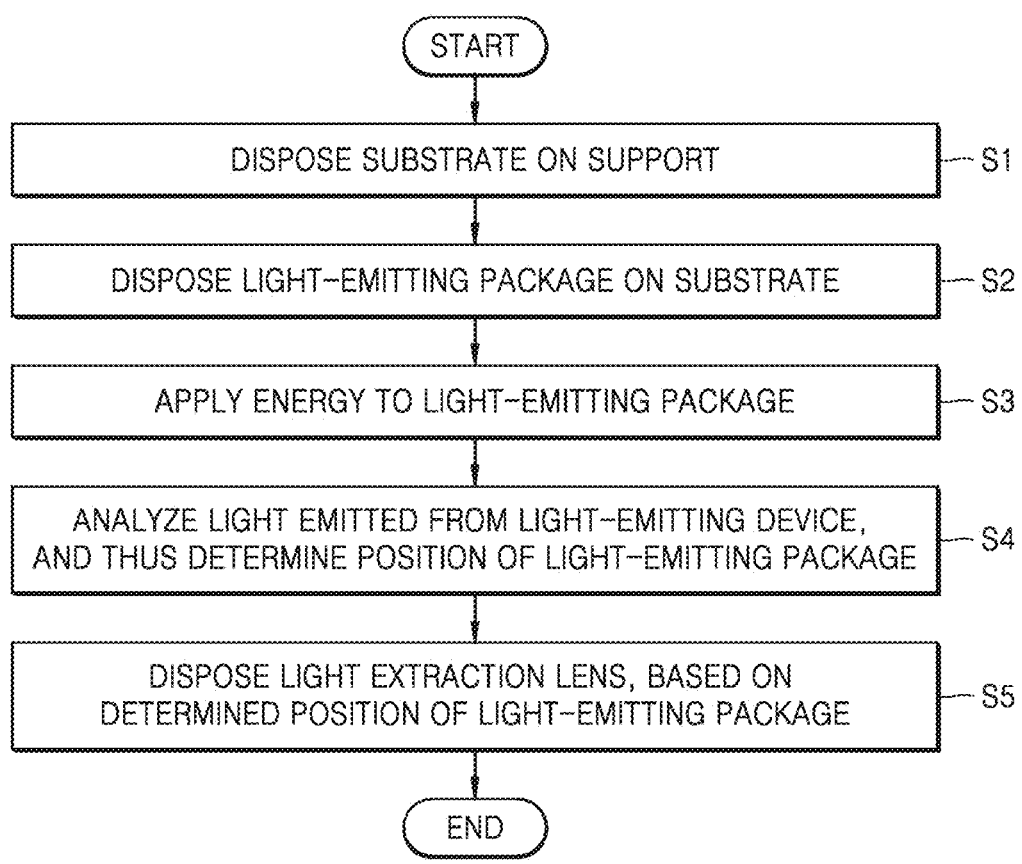
FIG. 16 is a flowchart of a method of manufacturing the light-emitting apparatus, according to an exemplary embodiment of the inventive concept.

FIG. 15 illustrates a concept of a light-emitting module inspecting apparatus 200, according to an exemplary embodiment of the inventive concept. FIG. 16 is a flowchart of a method of manufacturing a light-emitting apparatus, according to an exemplary embodiment of the inventive concept.

Referring to FIG. 15, the light-emitting module inspecting apparatus 200 may include a support 201 for supporting the substrate 110, an energy applier 210 for applying energy to the light-emitting package 120 on the substrate 110, a light sensing part 230 for sensing light that is emitted from the light-emitting device 124, and a position determiner 250 for determining a position of the light-emitting package 120 by using information obtained by the light sensing part 230.

Referring to FIGS. 15 and 16, the substrate 110 may be disposed on the support 201 (S1). Since the substrate 110 is previously described in detail, further descriptions are omitted here. As described above, the fiducial marks Mk1 and Mk2 (refer to FIG. 1) may be provided on the substrate 110.

The support 201 is not limited to a specific type, provided that the substrate 110 can be disposed on the support 201. Referring to FIG. 15, the support 201 is flat, but in another embodiment, the support 201 may have a structure for fixing both ends of the substrate 110.

Also, the support 201 may further include fixing parts 203 for securely fixing the substrate 110. The fixing parts 203 may be any fixing gadget such as a clip or a dice capable of holding the substrate 110, and a type of the fixing parts 203 is limitless.

Afterward, the light-emitting package 120 may be disposed on the substrate 110 (S2). The light-emitting package 120 may include the light-emitting device 124, and the descriptions thereof are previously provided in detail, thus, further descriptions are omitted here. Here, a phosphor may not exist in an encapsulation member that covers the light-emitting device 124. Thus, compared to a light-emitting package including a phosphor, the light-emitting package 120 may be inexpensively provided. In the present embodiment, light that is emitted from the light-emitting package 120 may be substantially equal to light that is emitted from the light-emitting device 124.

The light-emitting package 120 is supposed to be positioned at the target position T but may be disposed while deviating from the target position T, due to various factors. Thus, it is necessary to obtain information informing how far the light-emitting package 120 deviates from the target position T and information about an exact position at which the light-emitting package 120 is positioned. If the light-emitting package 120 is disposed at a location that is significantly far from the target position T and is outside a predetermined tolerance, it is required to repair or to discard the light-emitting package 120 or a module including the light-emitting package 120. Alternatively, if there is a demand for an additional structure such as the light extraction lens 130 to be arranged on the light-emitting package 120, it is required to detect the exact position of the light-emitting package 120.

When light is emitted from the light-emitting device 124, the exact position of the light-emitting package 120 may be determined by using the light. To do so, energy may be applied to the light-emitting package 120 so as to allow the light to be emitted from the light-emitting device 124 (S3). The energy that is applied to the light-emitting package 120 may be an electric energy or a photo energy. Referring to FIG. 15, the photo energy is applied to the light-emitting package 120 but one or more exemplary embodiments of the inventive concept are not limited thereto.

To do so, the light-emitting module inspecting apparatus 200 may further include the energy applier 210. The energy applier 210 may be a power supplier, or, as illustrated in FIG. 15, may be a light irradiator.

If the energy applier 210 is the light irradiator, the energy applier 210 may include a light source 211, a light filter 213, and a light focusing optical system 215. The light source 211 may be an instrument for generating light. In more detail, the light source 211 may generate visible light or UV light by receiving a power from an external source. The light source 211 may be selected, in consideration of a characteristic of the light-emitting device 124, and detailed descriptions thereof will be provided at a later time.

The light filter 213 may function to allow an irradiation direction of the light to be consistent and/or to limit a wavelength range of the irradiated light. For example, the light filter 213 may be configured to further transmit a wavelength of a predetermined region. In the present embodiment, the light filter 213 may include a collimator that allows the irradiation direction of the light to be consistent.

The light that is emitted from the energy applier 210 may be irradiated to the light-emitting package 120, and more particularly, the light may be mostly focused on the light-emitting device 124. In order to focus the irradiated light on a specific region, the light focusing optical system 215 may be provided. Referring to FIG. 15, the light focusing optical system 215 is arranged as one lens, but the light focusing optical system 215 may include two or more lenses and/or other light-focusing instruments.

It is not required that the light focused by the light focusing optical system 215 is focused only on the light-emitting device 124, and thus, only a portion of the focused light may be irradiated to the light-emitting device 124. In this regard, the amount of the portion of the focused light has to be sufficient to excite the light-emitting device 124 so as to allow light to be emitted from the light-emitting device 124.

The light that is emitted from the light source 211 may have a wavelength that is shorter than that of light emitted from the light-emitting device 124. For example, if the light-emitting device 124 is configured to emit blue light, the light emitted from the light source 211 may be UV light having a wavelength that is shorter than that of the blue light. In an exemplary embodiment, if the light-emitting device 124 is configured to emit red light, the light emitted from the light source 211 may be UV light, blue light, or green light that has a wavelength that is shorter than that of the red light.

In the present embodiment, the light that is emitted from the light source 211 and is irradiated to the light-emitting device 124 may have energy greater than a band gap energy of an random emission layer of the light-emitting device 124. The light that is emitted from the light source 211 and is incident on the light-emitting device 124 may excite the emission layer, and when the excited emission layer turns back to a ground state, light may be emitted from the light-emitting device 124.

Afterward, the light emitted from the light-emitting device 124 is analyzed, so that a position of the light-emitting package 120 may be determined (S4). Here, the light emitted from the light-emitting device 124 may be emitted due to the energy that was applied from the energy applier 210 to the light-emitting package 120.

In order to analyze the light emitted from the light-emitting device 124, the light-emitting module inspecting apparatus 200 may further include the light sensing part 230 for sensing the light that is emitted from the light-emitting device 124.

The light sensing part 230 may be configured to linescan the light emitted from the light-emitting device 124, to aggregate a plurality of pieces of data obtained therefrom, and to generate one piece of image information. Alternatively, the light sensing part 230 including charge-coupled devices (CCDs) that are two-dimensionally arrayed may be configured to obtain two-dimensional image information by allowing the light emitted from the light-emitting device 124 to be irradiated on the charge-coupled devices (CCDs).

The position determiner 250 may determine the position of the light-emitting package 120 by using the image information obtained by the light sensing part 230.

Figure 17A:
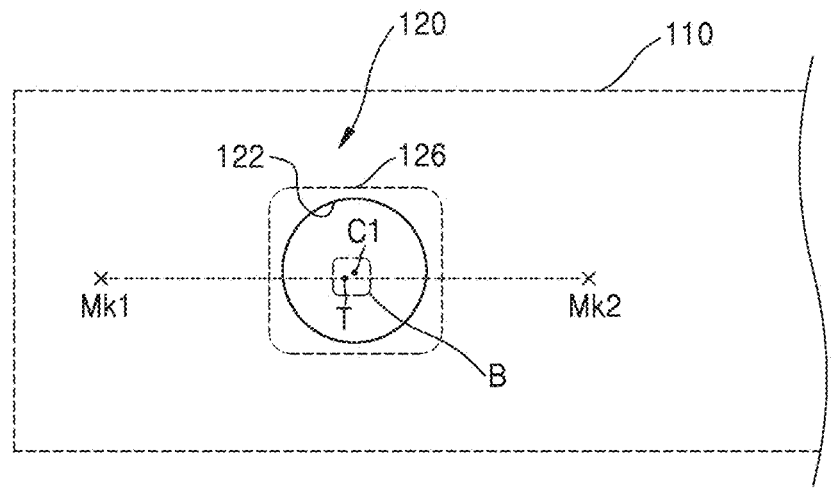
FIG. 17A illustrates an image of light that is emitted from a light-emitting package, which is obtained by a light sensing part, according to an exemplary embodiment of the inventive concept.
Figure 17B:
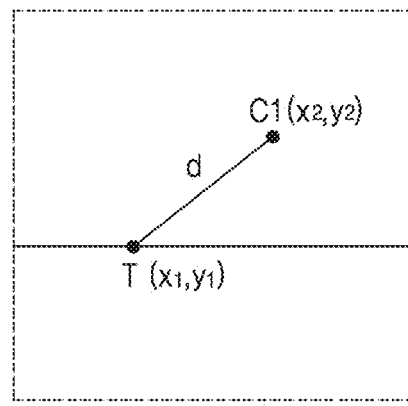
FIG. 17B is a magnified view of a portion B shown in FIG. 17A.

FIG. 17A illustrates an image of light that is emitted from the light-emitting package 120, which is obtained by the light sensing part 230, according to an exemplary embodiment of the inventive concept. FIG. 17B is a magnified view of a portion B shown in FIG. 17A.

Referring to FIG. 17A, the light emitted from the light-emitting device 124 (refer to FIG. 15) is extracted via the window 122 of the light-emitting package 120, thus, a portion of the window 122 is brightly shown whereas a portion other than the window is dimly shown since the light does not pass. Accordingly, a contour of the window 122 may be indirectly recognizable due to an outline of the area through which light is emitted.

As described above, since the light-emitting package 120 does not include a phosphor, any light that is emitted via the window 122 may be emitted from the light-emitting device 124.

If the window 122 has a round shape, the position of the light-emitting package 120 may be represented by a center C1 of the window 122. In this case, the light-emitting package 120 may be disposed on the substrate 110 so as to match the center C1 with the target position T. However, as described above, due to various factors, the light-emitting package 120 may be disposed while the center C1 deviates from the target position T.

Referring to FIG. 17B, the target position T may be already set as coordinates ($x_1$, $y_1$) by using the fiducial marks Mk1 and Mk2. That is, after the substrate 110 is disposed on the support 201, the light-emitting module inspecting apparatus 200 may obtain an image of a surface of the substrate 110 by using the light sensing part 230. Then the image of the surface of the substrate 110 is transferred to the position determiner 250. The fiducial marks Mk1 and Mk2 are recognizably provided on the surface of the substrate 110, and the position determiner 250 may determine a position of the target position T on the image of the surface of the substrate 110, by using positions of the fiducial marks Mk1 and Mk2.

As described with reference to FIG. 17A, a position of the center C1 of the window 122 may be calculated from the outline of the window 122 and may be set as coordinates ($x_2$, $y_2$). Therefore, a distance d between the center C1 and the target position T may be calculated.

If a value of the distance d is within a predetermined tolerance, the light-emitting module inspecting apparatus 200 may determine that a module meets a quality requirement. In contrast, if the value of the distance d is outside the predetermined tolerance, the light-emitting module inspecting apparatus 200 may determine that the module does not meets the quality requirement, and then the module may be repaired or may be discarded so that occurrence of unnecessary costs thereafter may be prevented.

The position of the center C1 of the window 122 may be calculated from the contour of the window 122 by using a commercialized software package.

Afterward, the light extraction lens 130 may be disposed on the light-emitting package 120, based on the determined position of the light-emitting package 120 (85). As described above with reference to FIG. 1, the target position of the light extraction lens 130 may be set so that the center C2 of the light extraction lens 130 is on the optical axis of the light-emitting package 120. However, as described above, when the light-emitting package 120 is actually disposed on the substrate 110, the light-emitting package 120 may be disposed while deviating from the target position. Therefore, the target position of the light extraction lens 130 may be adjusted so as to correspond to the determined position of the light-emitting package 120.

In more detail, before the light-emitting package 120 is disposed on the substrate 110, the coordinates ($x_1$, $y_1$) indicating the target position T of the light-emitting package 120 are set as a target position of the light extraction lens 130. However, after the light-emitting package 120 is disposed on the substrate 110, the determined position of the light-emitting package 120, i.e., the coordinates ($x_2$, $y_2$) that indicate the position of the center C1 of the window 122 of the light-emitting package 120 may be set as a new target position of the light extraction lens 130.

When the new target position of the light extraction lens 130 is determined, the light extraction lens 130 may be disposed on the new target position.

In the present embodiment, light is irradiated so as to apply the energy to the light-emitting package 120. In an exemplary embodiment below, a power is supplied so as to apply the energy to the light-emitting package 120.

Figure 18:
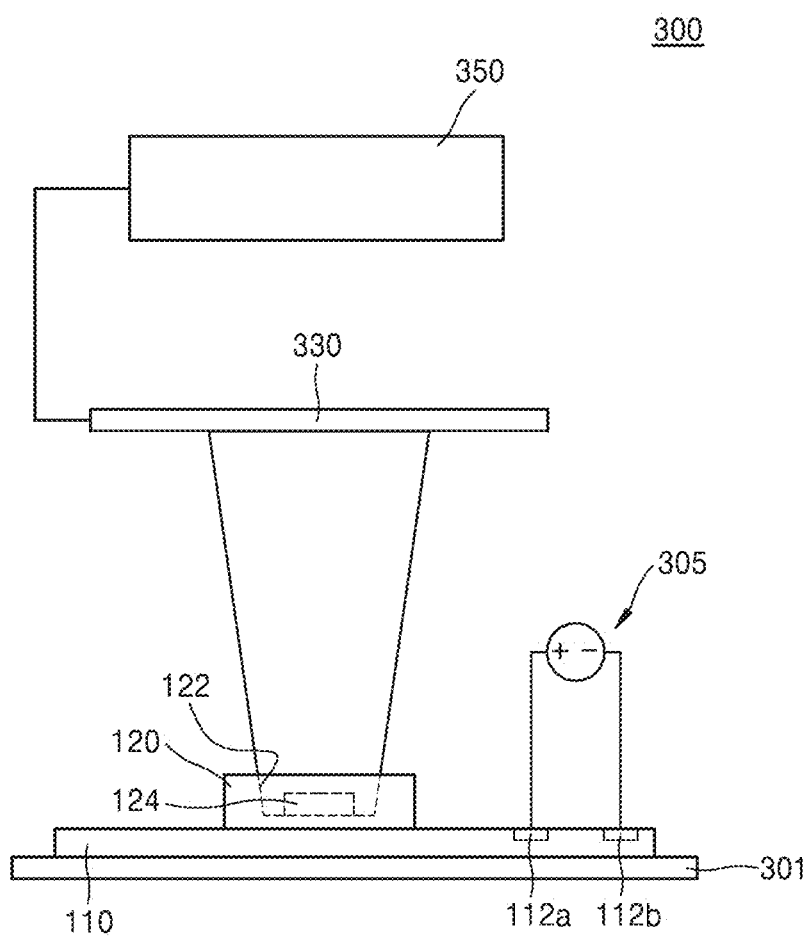
FIG. 18 illustrates a concept of a light-emitting module inspecting apparatus, according to another exemplary embodiment of the inventive concept.

FIG. 18 illustrates a concept of a light-emitting module inspecting apparatus 300, according to another exemplary embodiment of the inventive concept.

Referring to FIG. 18, the present embodiment is different from the exemplary embodiment of FIG. 15 in that, in the present embodiment, a power is supplied so as to apply energy, instead of irradiating light.

Terminals 112a and 112b capable of supplying a power to the light-emitting package 120 may be arranged on the substrate 110 that is disposed on a support 301. In order to supply the power to the light-emitting package 120, a power source 305 may be electrically connected to the terminals 112a and 112b.

When the power from the power source 305 is supplied to the light-emitting package 120 via the substrate 110, light may be emitted from the light-emitting device 124.

A light sensing part 330 may obtain an image from light that is emitted from the light-emitting device 124, and a position determiner 350 may determine a position of the light-emitting package 120 by using the image. Detailed descriptions about a procedure are already provided with reference to FIG. 15, thus, further descriptions are omitted here.

Figure 19:
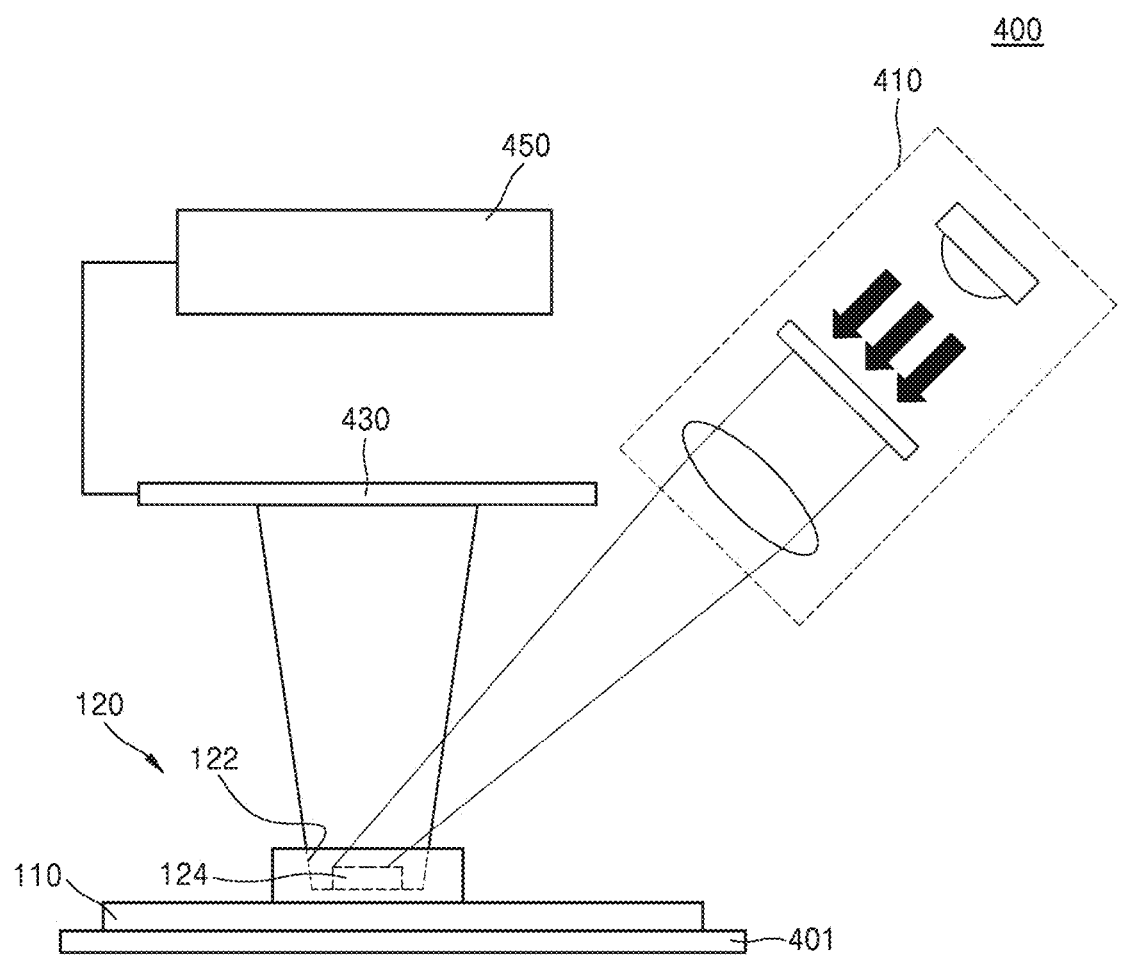
FIG. 19 illustrates a concept of a quality requirement determining apparatus, according to an exemplary embodiment of the inventive concept.
Figure 20:
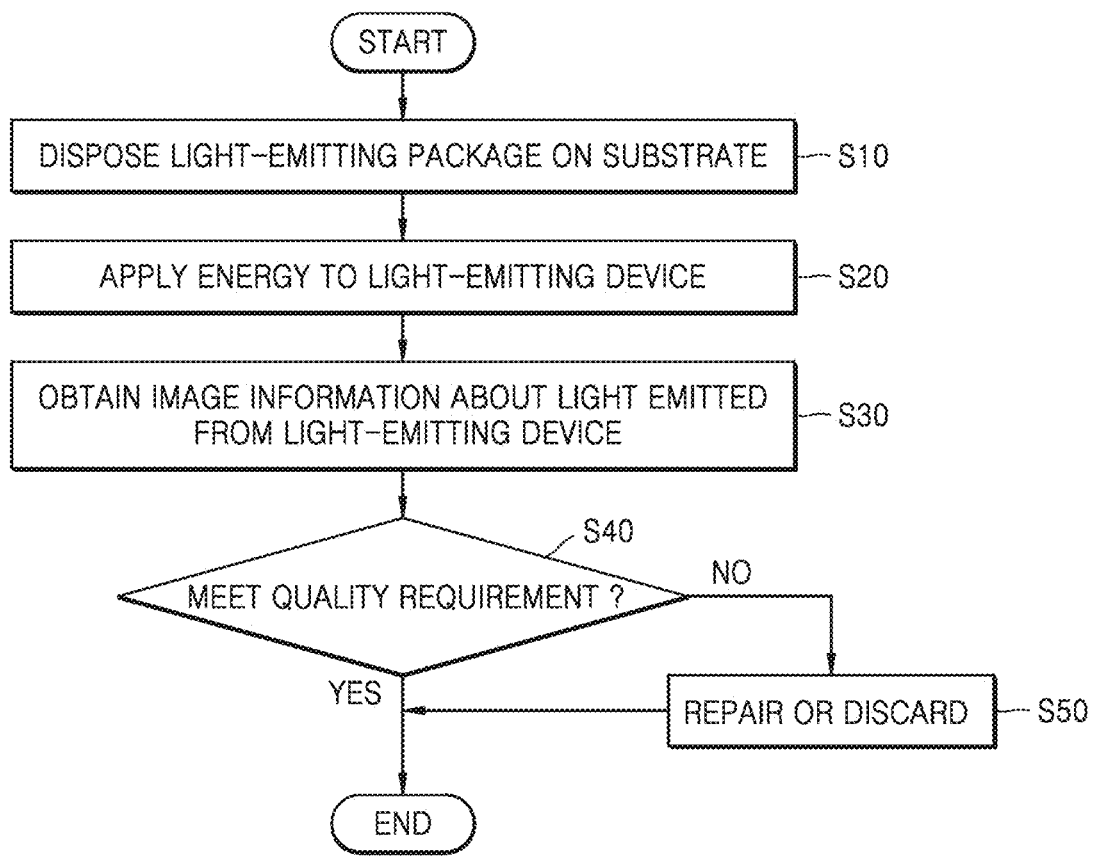
FIG. 20 is a flowchart of a method of determining whether a light-emitting module meets a quality requirement, according to an exemplary embodiment of the inventive concept.

The image information obtained by using the light sensing part 230 or 330 may be variously used in determining a non-defective product and a defective product. FIG. 19 illustrates a concept of a quality requirement determining apparatus 400, according to an exemplary embodiment of the inventive concept. FIG. 20 is a flowchart of a method of determining whether a light-emitting module meets a quality requirement, according to an exemplary embodiment of the inventive concept.

Referring to FIG. 19, the quality requirement determining apparatus 400 may have a structure that is substantially equal to that of the light-emitting module inspecting apparatus 200 of FIG. 15, except that the quality requirement determining apparatus 400 includes a quality requirement determiner 450, instead of the position determiner 250 shown in FIG. 15. Therefore, additional descriptions about the same characteristics are omitted here.

Referring to FIGS. 19 and 20, the substrate 110 is disposed on a support 401, and the light-emitting package 120 is disposed on the substrate 110 (S10). The light-emitting package 120 may be targeted to be disposed on its target position.

Afterward, energy may be applied to the light-emitting device 124 so as to allow light to be emitted from the light-emitting device 124 (S20). The energy may be applied by an energy applier 410. Referring to FIG. 19, light is irradiated, but, as described with reference to FIG. 18, energy may be applied to the light-emitting device 124 in a manner that a power is supplied via the substrate 110.

When the light-emitting device 124 emits light due to the energy, image information about the emitted light may be obtained from the emitted light (S30). The image information may be first obtained by a light sensing part 430.

The image information obtained by the light sensing part 430 may include emission spectrum information. Also, the quality requirement determiner 450 may determine, by using the emission spectrum information, whether a light-emitting module meets a quality requirement (S40). The quality requirement determiner 450 may determine whether the light-emitting module meets the quality requirement, in consideration of a position of a peak wavelength of emitted light.

Figure 21:
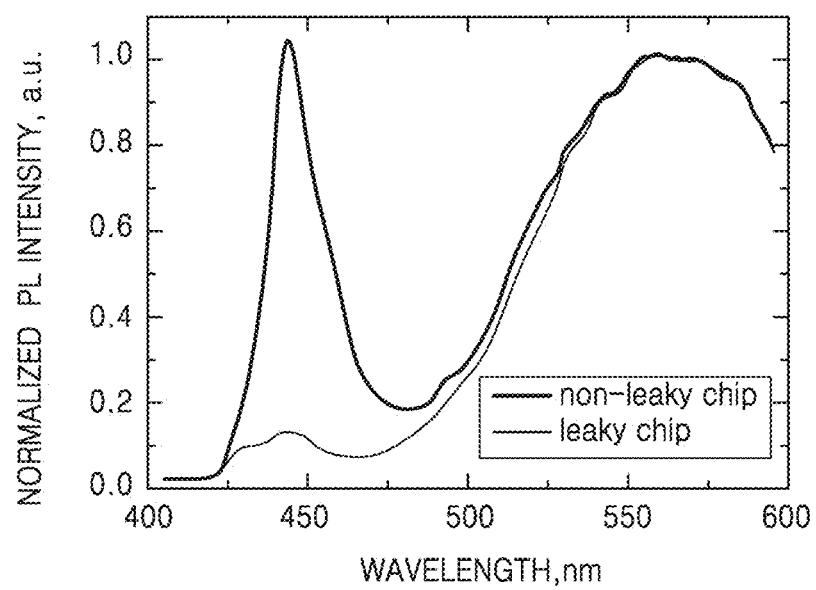
FIG. 21 illustrates emission spectrums as image information that is obtained by using a blue light-emitting device, according to an exemplary embodiment of the inventive concept'

FIG. 21 illustrates emission spectrums as image information that is obtained by using a blue light-emitting device, according to an exemplary embodiment of the inventive concept.

Referring to FIG. 21, one of the emission spectrum, which is shown as a bold solid line, indicates a normal spectrum in which an output from the blue light-emitting device is expected. The normal spectrum may be previously stored in the quality requirement determiner 450. In the present embodiment, a range of a normal peak wavelength may be stored in the quality requirement determiner 450.

The quality requirement determiner 450 extracts a peak wavelength from emission spectrum information included in the image information, and determines whether the peak wavelength is within the range of the normal peak wavelength. If the peak wavelength is within the range of the normal peak wavelength (refer to the bold solid line of FIG. 21), the quality requirement determiner 450 may determine that a light-emitting module including the blue light-emitting device meets a quality requirement. However, if the peak wavelength is outside the range of the normal peak wavelength (refer to a thin solid line of FIG. 21), the quality requirement determiner 450 may determine that the light-emitting module including the blue light-emitting device does not meet the quality requirement.

However, a method of determining whether the light-emitting module meets the quality requirement is not limited to the position of the peak wavelength.

If the light-emitting module is determined as a defective product, the light-emitting module may be repaired or may be discarded (S50).

Figure 22:
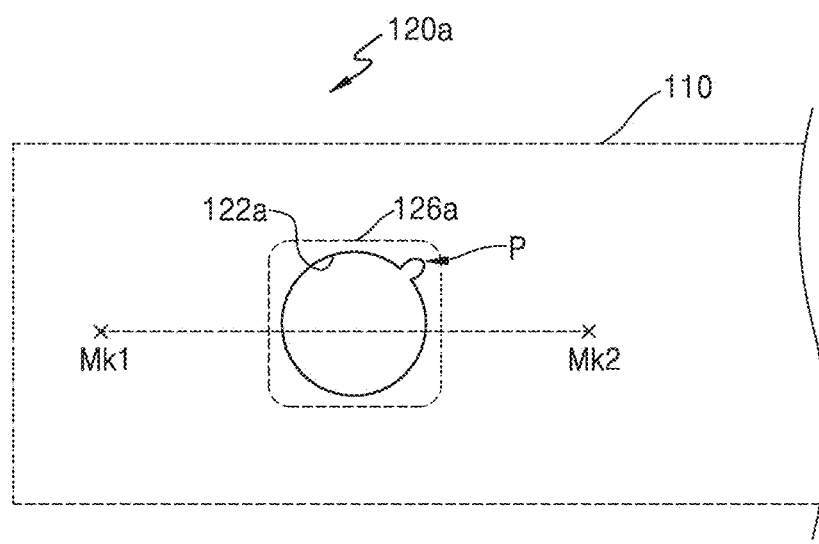
FIG. 22 illustrates an image of light that is emitted from a light-emitting package, wherein the image is obtained by a light sensing part, according to another exemplary embodiment of the inventive concept.

FIG. 22 illustrates an image of light that is emitted from a light-emitting package 120a, wherein the image is obtained by the light sensing part 430, according to another exemplary embodiment of the inventive concept.

Referring to FIG. 22, a contour of a window 122a may be extracted, according to descriptions with reference to FIGS. 15 and 16.

Here, if the extracted contour of the window 122a has a shape that is not a shape of a normal window, this may mean that a package frame 126a is damaged, such that a crack is formed, and light is leaked along the crack. For example, if a contour image having a different shape from a target shape of a window is obtained, the package frame 126a may be a defective product.

In particular, if the extracted contour of the window 122a has the shape having a projection (refer to a portion P shown in FIG. 22) that is projected from the shape of the normal window, this may mean that a direction of light emitted from the window 122a is not intentionally controlled, so that an illumination quality may deteriorate. Thus, as described in FIG. 22, if the extracted contour has the unintended projection, the light-emitting package 120a may be determined as the defective product.

Figure 23A:
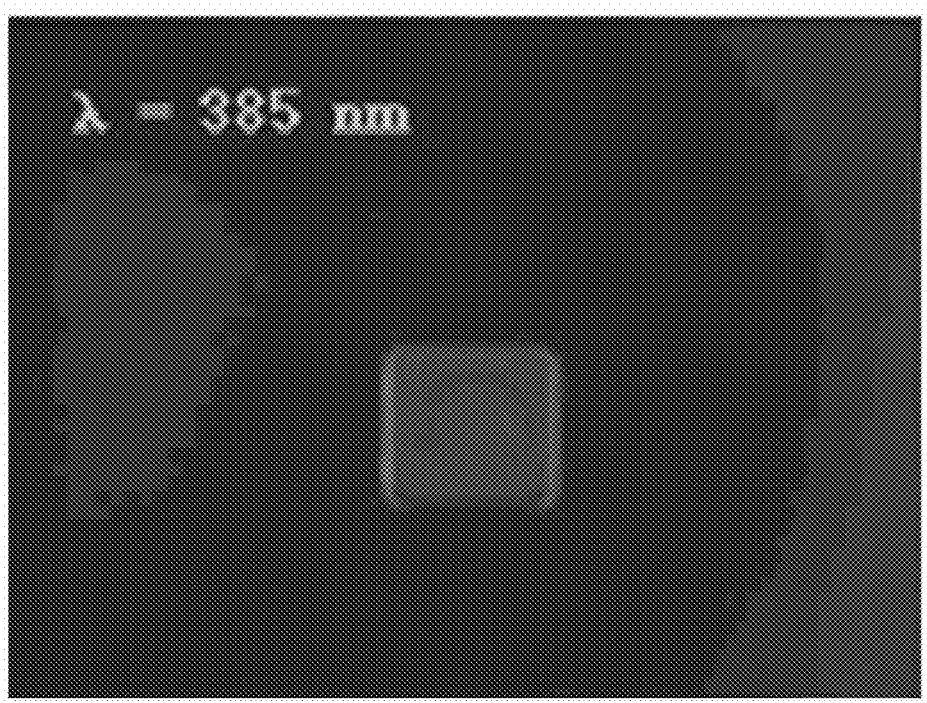
FIGS. 23A and 23B are images showing whether light is emitted from each of light-emitting devices, when light having a wavelength of 385 nm was irradiated to light-emitting packages that are arranged on substrates.
Figure 23B:
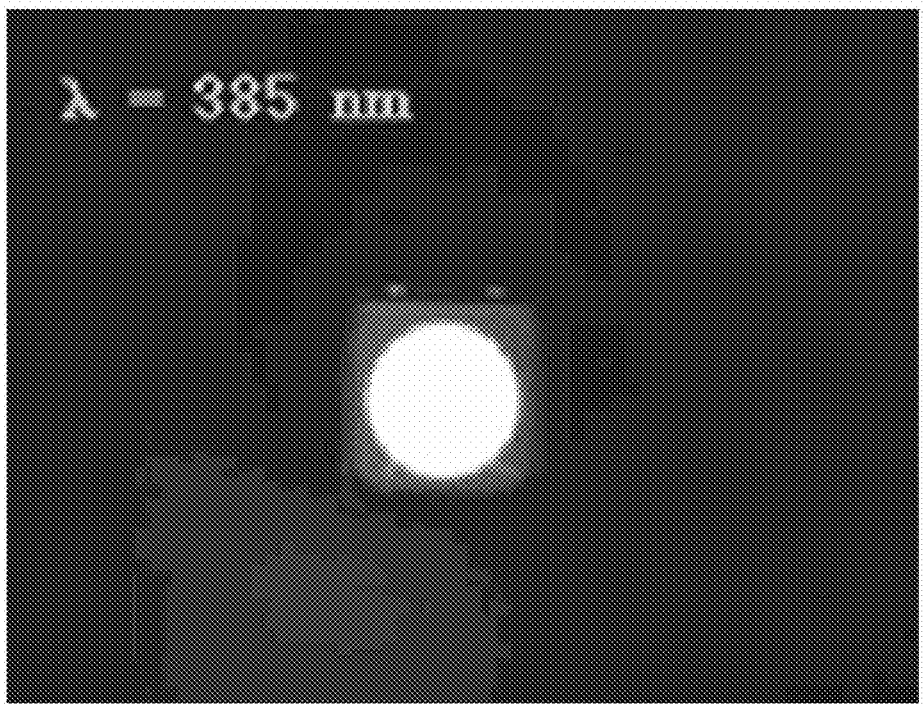

FIGS. 23A and 23B are images showing whether light is emitted from each of light-emitting devices, when light having a wavelength of 385 nm was irradiated to light-emitting packages that are arranged on substrates. FIG. 23A is the image of a case in which the light having the wavelength of 385 nm was irradiated without using a light focusing optical system, and FIG. 23B is the image of a case in which the light having the wavelength of 385 nm was irradiated by using the light focusing optical system.

It is apparent that emission does not occur in the light-emitting device shown in FIG. 23A, whereas a vivid contour of a window is obtained as shown in FIG. 23B.

Figure 24:
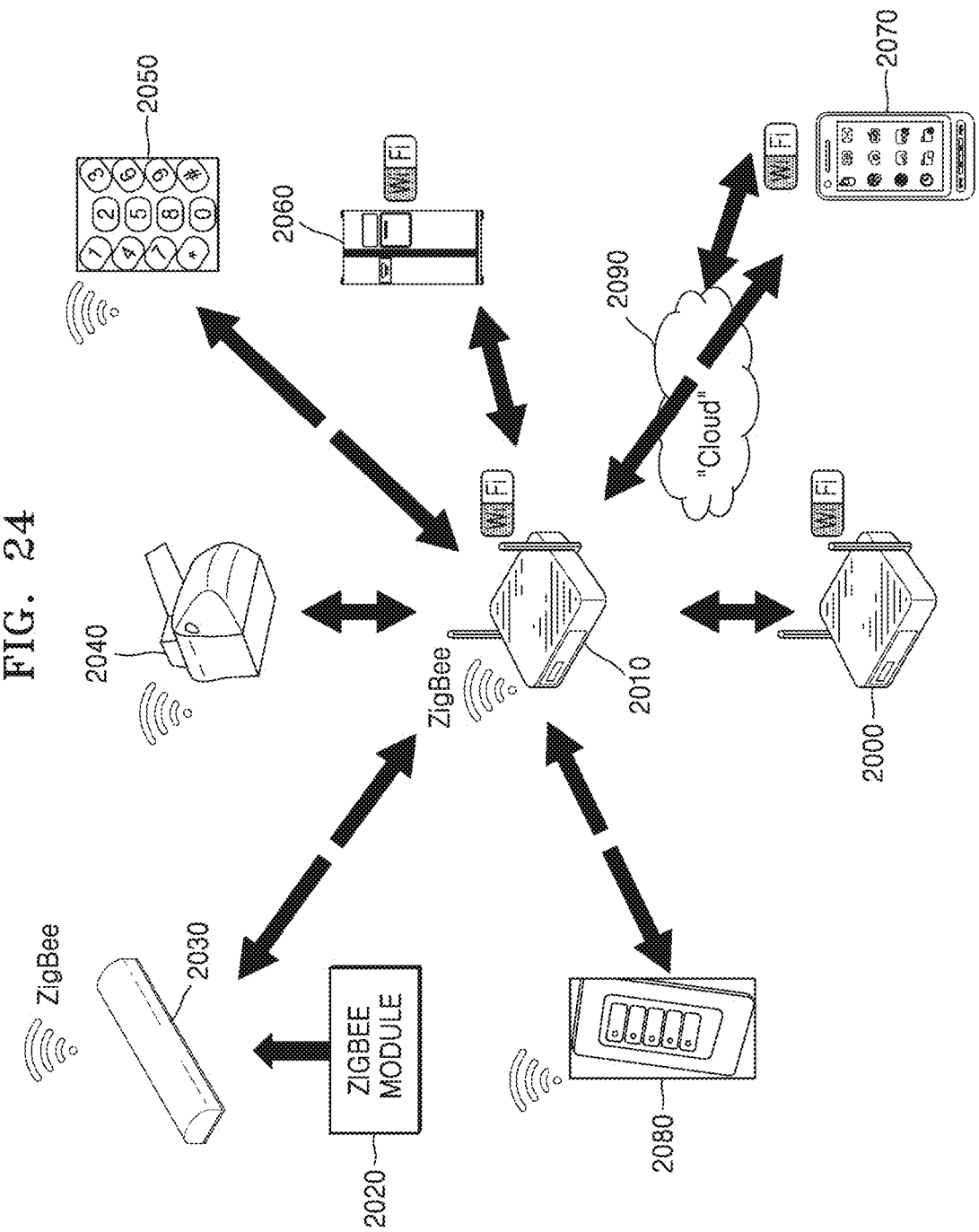
FIGS. 24 and 25 illustrate a home network to which a lighting system using the light-emitting apparatus is applied, according to an embodiment of the inventive concept.
Figure 25:
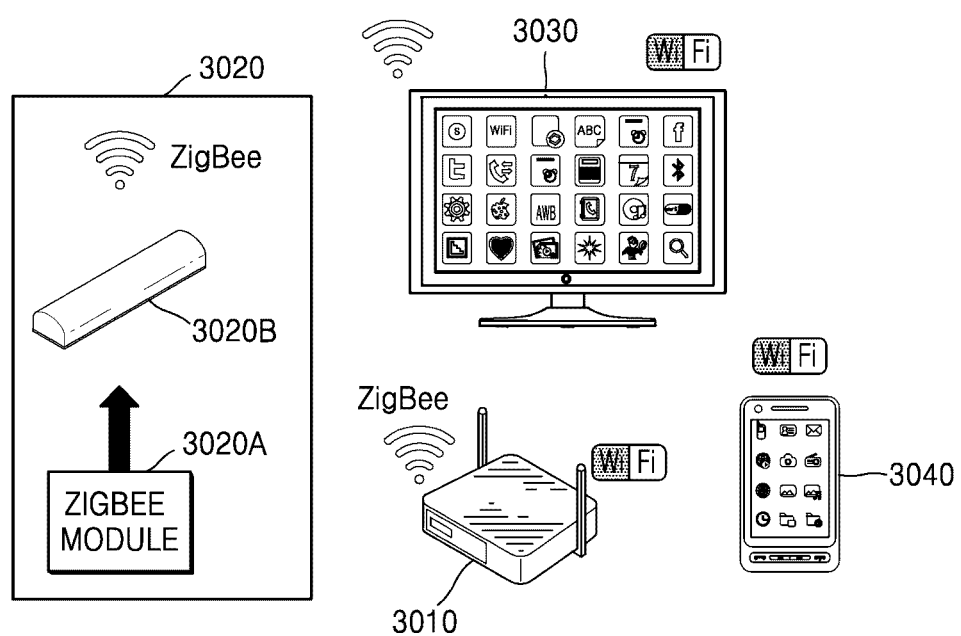

FIGS. 24 and 25 illustrate a home network to which a lighting system using the light-emitting apparatus is applied, according to an exemplary embodiment of the inventive concept.

As illustrated in FIG. 24, the home network may include a home wireless router 2000, a gateway hub 2010, a ZigBee module 2020, an LED lamp 2030, a garage door lock 2040, a wireless door lock 2050, home application 2060, a cell phone 2070, a wall-mounted switch 2080, and a cloud network 2090.

According to operating statuses of a bedroom, a living room, an entrance, a garage, electric home appliances, or the like and ambient environments/situations, illumination brightness of the LED lamp 2030 may be automatically adjusted by using in-house wireless communication such as ZigBee, Wi-Fi, or the like.

For example, as illustrated in FIG. 25, according to a type of a program broadcasted on a TV 3030 or brightness of a screen of the TV 3030, illumination brightness of an LED lamp 3020B may be automatically adjusted by using a gateway 3010 and a ZigBee module 3020A. In an embodiment, when a cozy atmosphere is required due to broadcasting of a soap opera, illumination may be adjusted to have a color temperature equal to or less than 5,000K according to the cozy atmosphere. In another embodiment, when a light atmosphere is required due to broadcasting of a comedy program, illumination may be adjusted to have a color temperature equal to or greater than 5,000K and may have a blue-based white color.

The ZigBee module 2020 or 3020A may be integrally modularized with a photo sensor and also may be integrally formed with a light-emitting apparatus.

When visible-light wireless communication technology is used, information is wirelessly delivered by using light in a visible wavelength band. Differently from conventional wired optical communication technology and conventional infrared wireless communication, the visible-light wireless communication technology uses light in a visible wavelength band, i.e., visible light having a particular frequency different from that of the light-emitting package described above with reference to the one or more exemplary embodiments. Also, differently from the conventional wired optical communication technology, the visible-light wireless communication technology uses a wireless environment. Also, the visible-light wireless communication technology is highly convenient and physically secure since it is not regulated or controlled in terms of frequency usage, unlike the conventional radio frequency (RF) wireless communication, is unique since a user may check a communication link, and most of all, has a convergence characteristic by simultaneously allowing a light source to be used for its original purpose and an additional communication purpose.

Also, the LED illumination may be used as inner or outer light sources for vehicles. For the inner light sources, the LED illumination may be used as an inner light, a reading light, a gauge board, or the like for vehicles, and for the outer light sources, the LED illumination may be used as a headlight, a brake light, a direction guide light, a fog light, a daytime running light, or the like for vehicles.

An LED using a particular wavelength may promote a growth of plants, may stabilize human feelings, or may help treatment for a disease. The LED may be applied to a light source that is used in robots or various mechanical equipment. In addition to the LED having low power consumption and a long lifetime, it is possible to embody illumination of the present invention in combination with a nature-friendly renewable energy power system such as a solar cell system, a wind power system, or the like.

As described above, according to the one or more of the above exemplary embodiments, by using the method of manufacturing the light-emitting apparatus, the light-emit-

What is claimed is:

1. A method of manufacturing a light-emitting apparatus, the method comprising:
   disposing a substrate on a support;
   disposing a light-emitting package on the substrate so as to allow the light-emitting package to be positioned at a target position on the substrate, the light-emitting package comprising a light-emitting device;
   applying energy to the light-emitting package to make the light-emitting device emit light; and
   determining a position where the light-emitting package is actually disposed by analyzing the light that is emitted from the light-emitting device due to the energy.

2. The method of claim 1, wherein applying the energy comprises irradiating light onto the light-emitting device.

3. The method of claim 2, wherein irradiating the light comprises:
   focusing a portion of the irradiated light; and
   irradiating the focused portion of the irradiated light onto the light-emitting device.

4. The method of claim 3, wherein focusing the portion of the irradiated light is performed by a light focusing optical system.

5. The method of claim 3, wherein the light-emitting package has a window with a predetermined shape, and determining the position comprises:
   sensing the light that is emitted from the light-emitting device; and
   determining the position of the light-emitting package by determining a center of the window with the predetermined shape.

6. The method of claim 2, wherein a wavelength of the light that is irradiated to the light-emitting device is shorter than a wavelength of the light that is emitted from the light-emitting device.

7. The method of claim 1, wherein applying the energy comprises applying an electric power to the light-emitting device.

8. The method of claim 1, further comprising disposing a lens on the light-emitting package based on the position where the light-emitting package is actually disposed.

9. The method of claim 8, wherein the lens is disposed so that a center of the window of the light-emitting package is on a central axis of the lens.

10. The method of claim 8, wherein disposing the lens comprises:
    setting the position where the light-emitting package is actually disposed as a new target position for the lens; and
    disposing the lens at the new target position.

11. The method of claim 1, wherein the light-emitting package does not comprise a phosphor.

12. A method of manufacturing a light-emitting apparatus, the method comprising:
    disposing a light-emitting package comprising a light-emitting device on a substrate so as to allow the light-emitting package to be positioned at a target position on the substrate, fiducial marks being provided on the substrate;
    applying energy to the light-emitting device to make the light-emitting device emit light; and
    obtaining image information about the light that is emitted from the light-emitting device.

13. The method of claim 12, wherein obtaining the image information comprises obtaining information about a wavelength distribution of the light emitted from the light-emitting device.

14. The method of claim 13, further comprising, after the obtaining of the image information, determining the light-emitting package as a non-defective product if a peak wavelength of the light emitted from the light-emitting device is within a predetermined range of a normal peak wavelength, or determining the light-emitting package as a defective product if the peak wavelength of the light emitted from the light-emitting device is not within the predetermined range of the normal peak wavelength.

15. The method of claim 12, wherein obtaining the image information comprises extracting a contour of a window of the light-emitting package based on the light emitted from the light-emitting device.

16. The method of claim 15, wherein the window of the light-emitting package has a predetermined shape, and
    the method further comprises determining the light-emitting package as a defective product if the extracted contour of the window differs from the predetermined shape.

17. The method of claim 15, wherein the window of the light-emitting package has a predetermined shape, and
    the method further comprises:
    detecting a position of a center of the window; and
    storing the position of the center of the window as a position of the light-emitting package.

18. The method of claim 17, further comprising calculating a distance between the position of the light-emitting package and the target position and determining that the light-emitting apparatus is non-defective or defective based on the calculated distance.

19. The method of claim 12, wherein the light-emitting package does not comprise a phosphor.

20. A method of manufacturing a light-emitting apparatus, the method comprising:
    disposing a substrate on a support; disposing a light-emitting package comprising a light-emitting device on the substrate;
    applying energy to the light-emitting package to make the light-emitting device emit light; and
    analyzing the light that is emitted from the light-emitting device due to the energy, and determining whether the light-emitting package meets a quality requirement based on the analyzed emitted light.

* * * * *